United States Patent
Tsunashima

(10) Patent No.: US 10,452,183 B2
(45) Date of Patent: Oct. 22, 2019

(54) DISPLAY DEVICE WITH A TOUCH DETECTION FUNCTION THAT CAN RESTART DRIVE OF SCANNING LINES AFTER A SCANNING LINE DRIVE OPERATION IS TEMPORARILY STOPPED

(71) Applicant: Japan Display Inc., Minato-ku (JP)

(72) Inventor: Takanori Tsunashima, Tokyo (JP)

(73) Assignee: Japan Display Inc., Minato-ku (JP)

( * ) Notice: Subject to any disclaimer, the term of this patent is extended or adjusted under 35 U.S.C. 154(b) by 1 day.

(21) Appl. No.: 15/848,375

(22) Filed: Dec. 20, 2017

(65) Prior Publication Data
US 2018/0181243 A1 Jun. 28, 2018

(30) Foreign Application Priority Data
Dec. 27, 2016 (JP) .................. 2016-253814

(51) Int. Cl.
*G06F 3/041* (2006.01)
*G06F 3/044* (2006.01)
*G09G 3/36* (2006.01)
*G11C 19/28* (2006.01)

(52) U.S. Cl.
CPC .......... *G06F 3/0412* (2013.01); *G06F 3/0416* (2013.01); *G09G 3/3648* (2013.01); *G09G 3/3666* (2013.01); *G09G 3/3677* (2013.01); *G11C 19/28* (2013.01); *G06F 3/044* (2013.01); *G09G 2310/0286* (2013.01); *G09G 2310/0291* (2013.01)

(58) Field of Classification Search
CPC ...... G06F 3/0412; G06F 3/0416; G06F 3/044; G09G 3/3677; G09G 3/3666; G09G 3/3648; G09G 2310/0291; G09G 2310/0286; G11C 19/28

See application file for complete search history.

(56) References Cited

U.S. PATENT DOCUMENTS

2012/0006060 A1   1/2012   Terao
2013/0241814 A1*  9/2013   Hirabayashi ......... G09G 3/3677
                                                        345/100

(Continued)

FOREIGN PATENT DOCUMENTS

JP   2012-19108   1/2012

*Primary Examiner* — Temesghen Ghebretinsae
*Assistant Examiner* — Ivelisse Martinez Quiles
(74) *Attorney, Agent, or Firm* — Oblon, McClelland, Maier & Neustadt, L.L.P.

(57) ABSTRACT

According to one embodiment, a display device equipped with a touch detection function includes scanning lines, and series-connected unit register circuits, wherein a touch detection operation is performed in a scan stop period, each of the unit register circuits is composed of single-channel transistors, holds and outputs a scanning signal when a voltage leak of a held signal is equal to or lower than a predetermined value, a dummy unit register circuit is provided between a previous unit register circuit which drives a last scanning line before start of the scan stop period and a subsequent unit register circuit which drives a first scanning line after end of the scan stop period, and the dummy unit register circuit continues outputting the scanning signal to the subsequent unit register circuit during the scan stop period.

8 Claims, 18 Drawing Sheets

(56) References Cited

U.S. PATENT DOCUMENTS

| | | | |
|---|---|---|---|
| 2015/0131771 A1* | 5/2015 | Hu | G11C 19/28 377/68 |
| 2015/0269897 A1* | 9/2015 | Kitsomboonloha | G06F 3/0412 345/205 |
| 2016/0379586 A1* | 12/2016 | Wu | G06F 3/044 345/174 |
| 2018/0121023 A1* | 5/2018 | Kim | G06F 3/0412 |

* cited by examiner

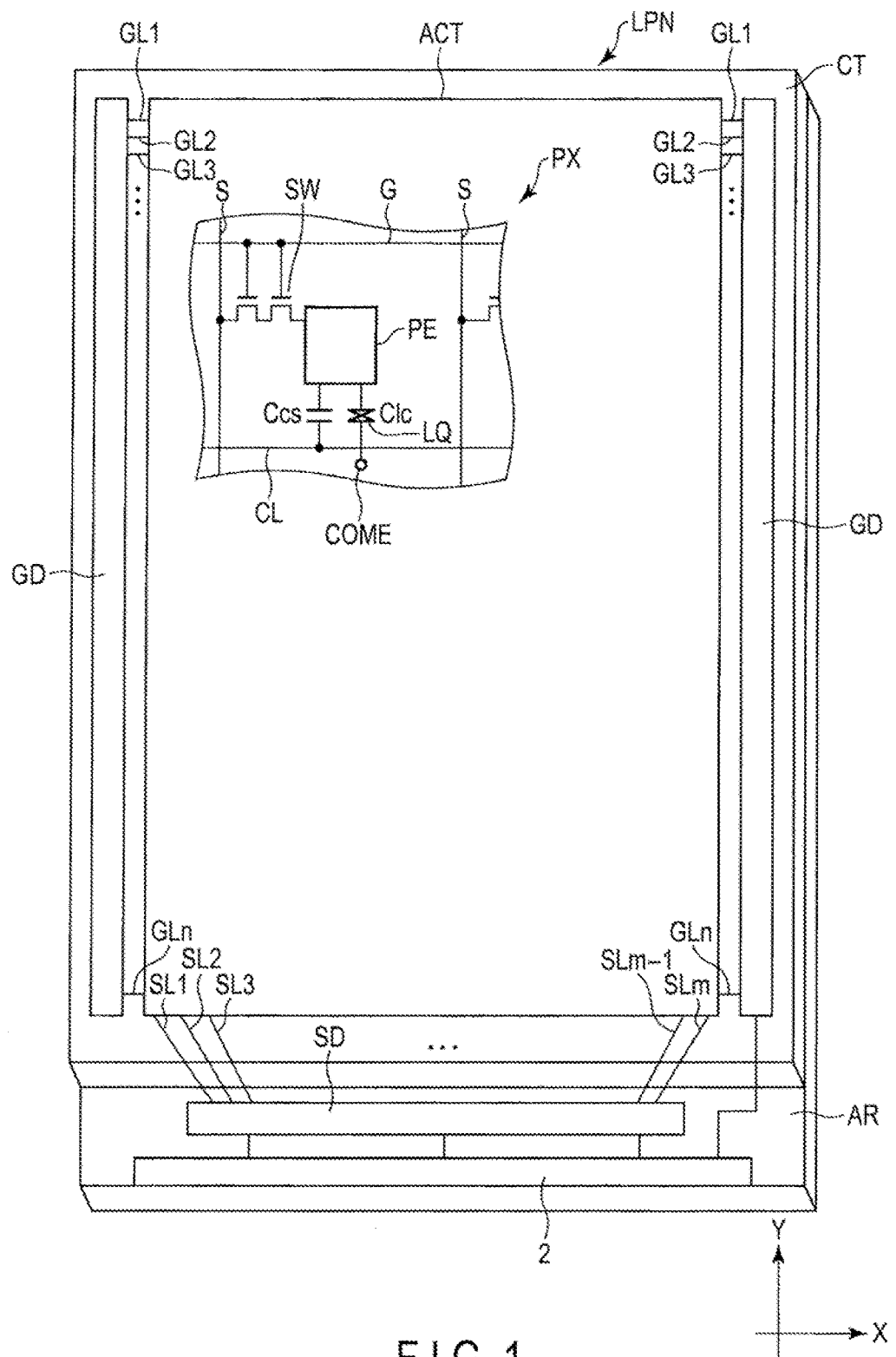
F I G. 1

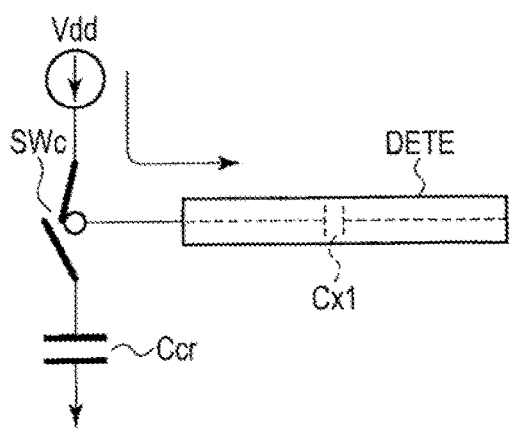 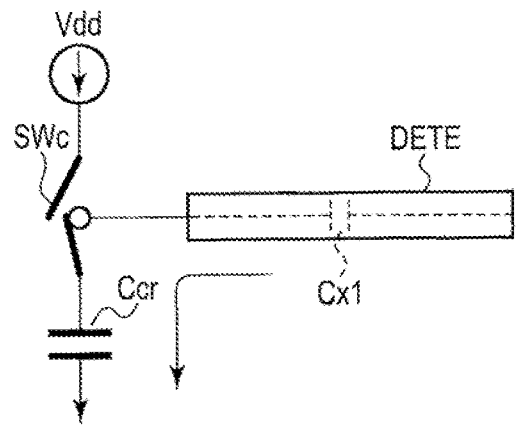
FIG. 2A  FIG. 2B
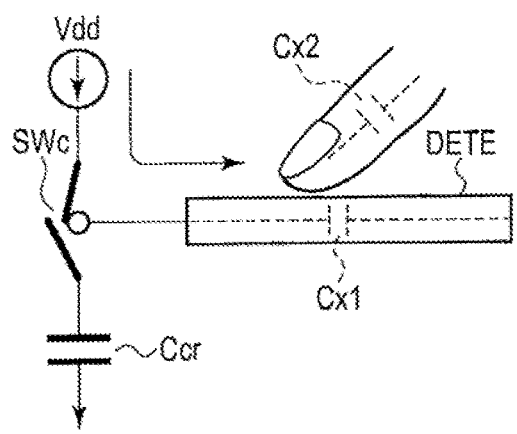 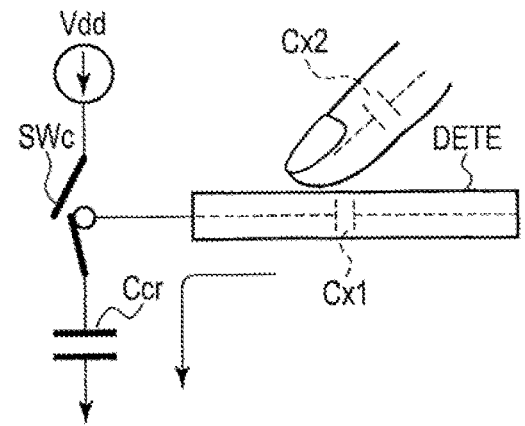
FIG. 3A  FIG. 3B

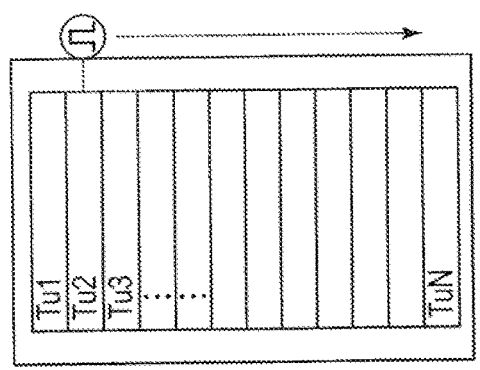
F I G. 6A
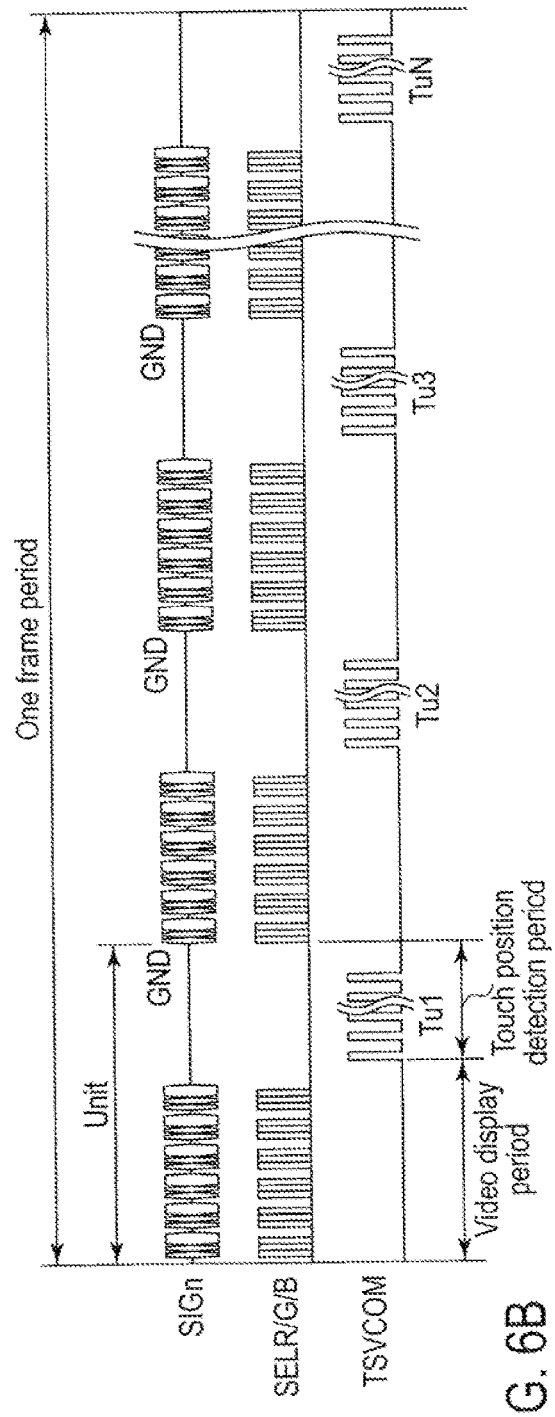
F I G. 6B

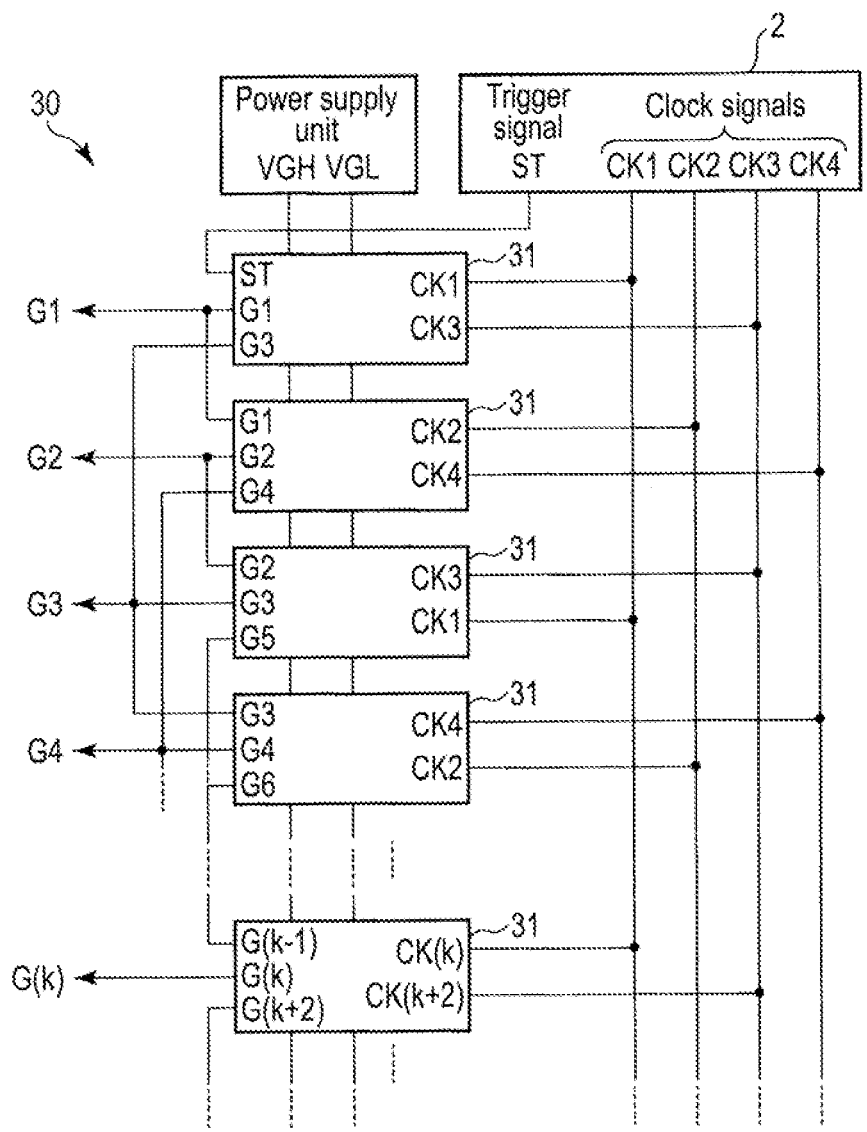
F I G. 7

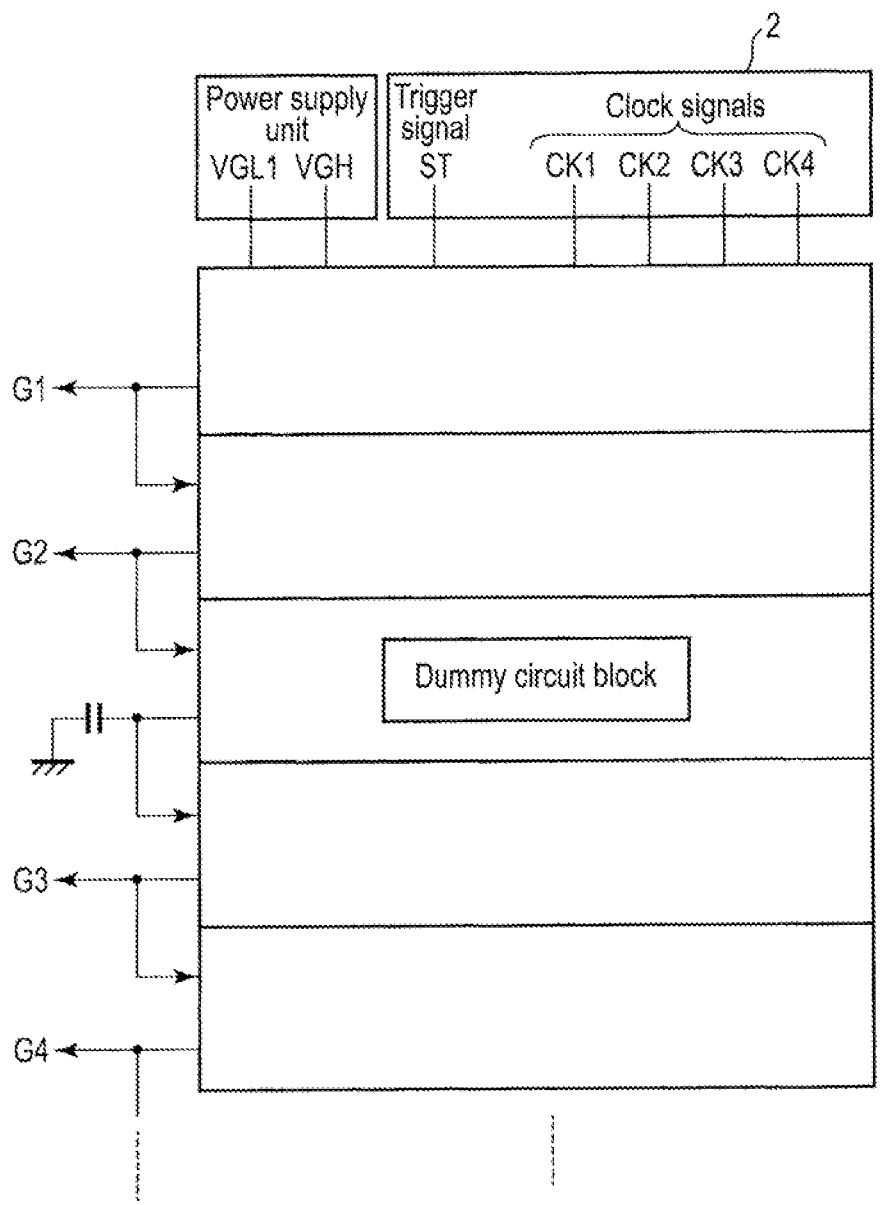
F I G. 10

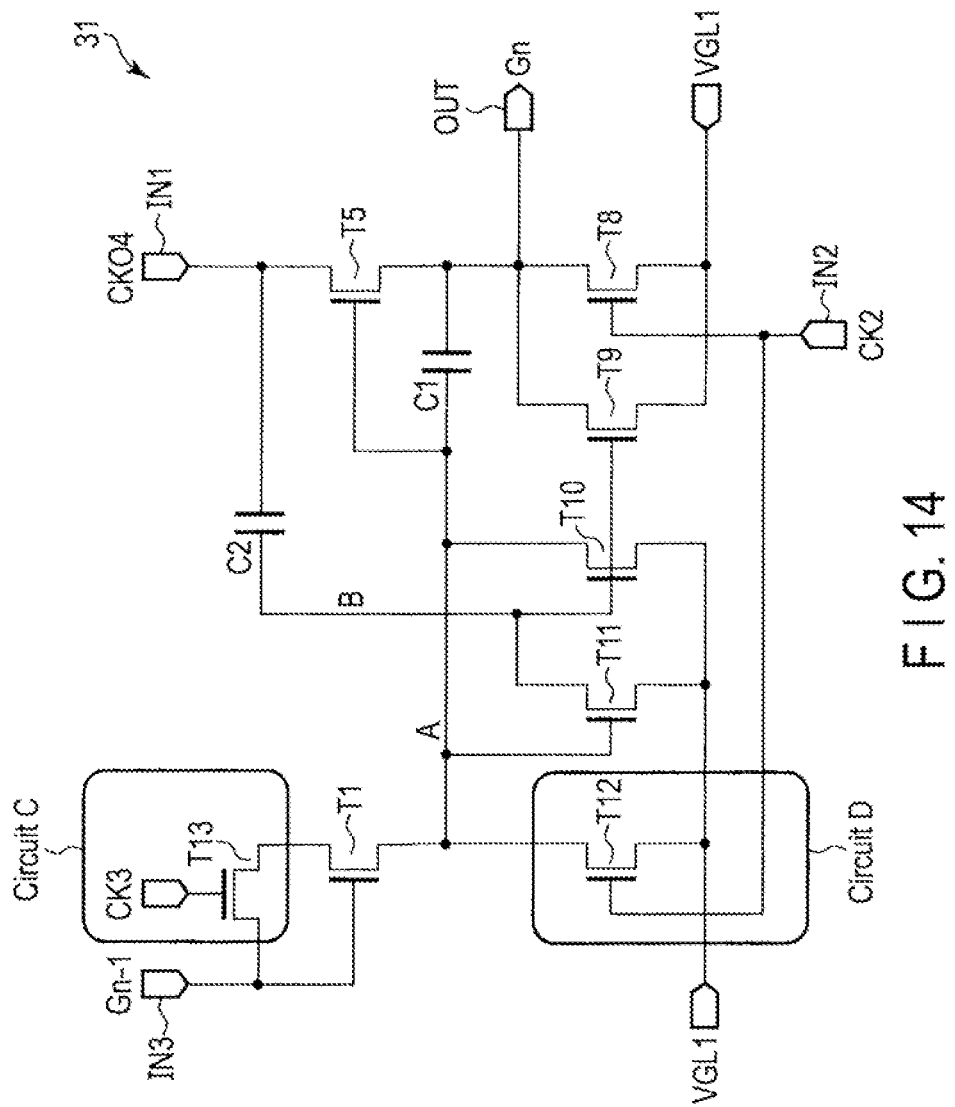
F I G. 14

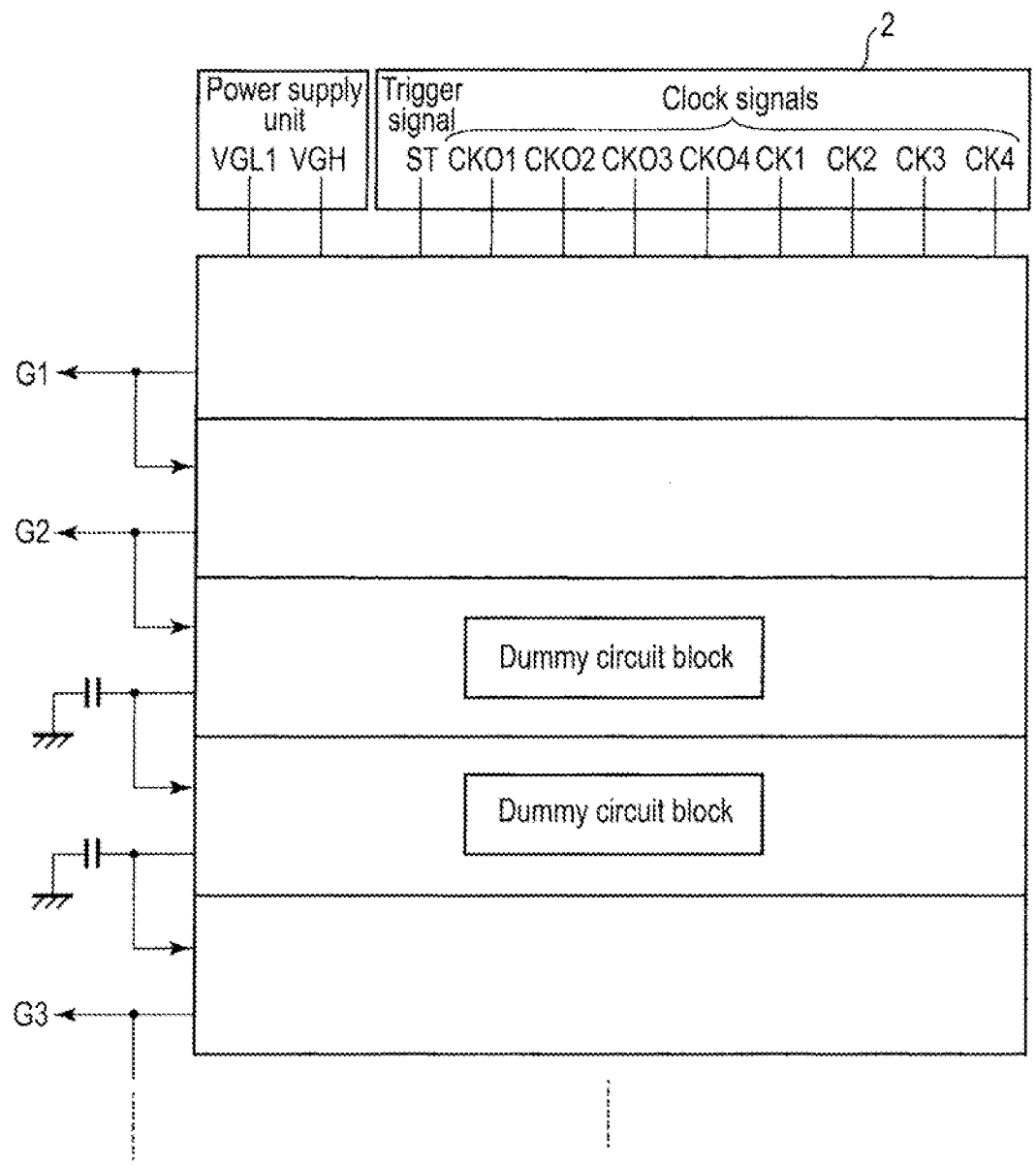
F I G. 16

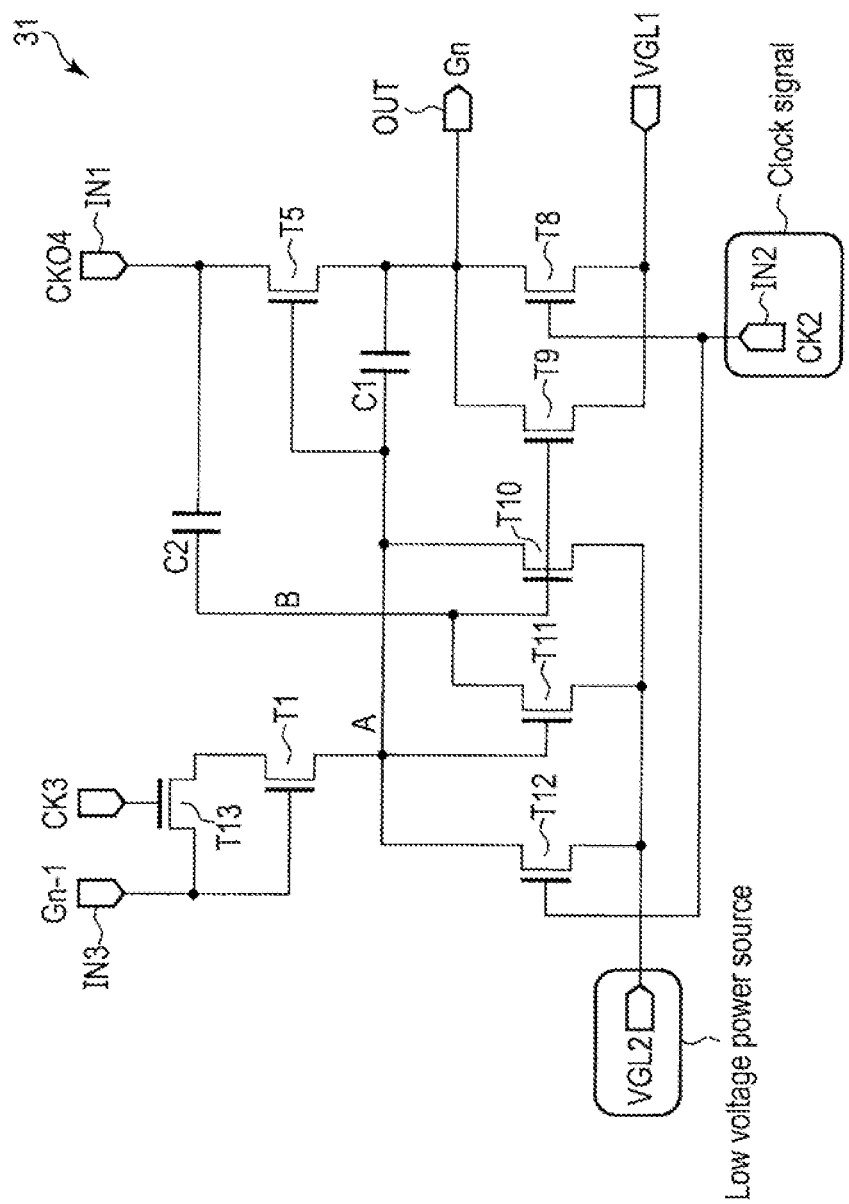
F I G. 18

| VGH | 16.5V |
|---|---|
| VGL1 | -9.5V |
| VGL2 | -11.5V |
| VGL3 | -13.5V |
| ST | VGH / VGL1 |
| CK1~4 | VGH / VGL3 |
| CKO1~4 | VGH / VGL1 |

F I G. 19

DISPLAY DEVICE WITH A TOUCH DETECTION FUNCTION THAT CAN RESTART DRIVE OF SCANNING LINES AFTER A SCANNING LINE DRIVE OPERATION IS TEMPORARILY STOPPED

CROSS-REFERENCE TO RELATED APPLICATIONS

This application is based upon and claims the benefit of priority from Japanese Patent Application No. 2016-253814, filed Dec. 27, 2016, the entire contents of which are incorporated herein by reference.

FIELD

Embodiments described herein relate generally to a display device and a unit register circuit.

BACKGROUND

Liquid crystal display devices have been used as displays of various devices thanks to their lightness, slimness and low power consumption. In particular, active-matrix liquid crystal display devices comprising transistors arranged in respective pixels have become widespread as displays of various devices, for example, TV receivers, vehicle-mounted displays such as car navigation devices, notebook computers, tablet PCs, mobile terminals such as cellular telephones and smartphones, and the like.

Recently, research and development of thin-film transistors (TFTs) using an organic semiconductor and an oxide semiconductor, having a higher electron drift velocity than amorphous silicon TFTs used in the liquid crystal display devices have been conducted actively. In TFT using the organic semiconductor and the oxide semiconductor, a single-channel transistor (pMOS or nMOS) is used.

Incidentally, a drive circuit which drives a line group of scanning lines and the like is provided in a display area, in a liquid crystal display device. A scanning line driver composed of a single-channel transistor (for example, nMOS transistor) is well known as such a drive circuit. The scanning line driver sequentially drives the scanning lines, a video signal is written in pixels connected to the driven scanning lines, and the video is thereby displayed. The scanning line driver uses the single-channel transistor for a shift register which shifts the phase of the input signal and outputs the signal.

In contrast, a liquid crystal display device equipped with what is called an in-cell type touch detection function in which a common electrode for display originally provided in the liquid crystal display device serves as one of a pair of touch sensor electrodes while the other electrode (touch detection electrode) is disposed to cross the common electrode has been proposed.

In the liquid crystal display device equipped with what is called an in-cell type touch detection function, since the touch operation and the display operation are driven by time division, the touch operation is executed by temporarily stopping the drive of the scanning line, and then the drive for display is restarted at the scanning line position where the drive of the scanning line is stopped. In the scanning line driver composed of the single-channel transistor, the drive of the scanning line cannot be restarted by allowing a current to leak from the single-channel transistor in a period in which the drive is temporarily stopped, and the drive of the scanning line may be stopped.

BRIEF DESCRIPTION OF THE DRAWINGS

FIG. 1 is a diagram schematically showing a configuration example of a liquid crystal display device according to a First Embodiment.

FIG. 2A is a diagram for explanation of a principle of a self-detection mode in the liquid crystal display device according to the First Embodiment.

FIG. 2B is a diagram for explanation of a principle of a self-detection mode in the liquid crystal display device according to the First Embodiment.

FIG. 3A is a diagram for explanation of a principle of the self-detection mode in the liquid crystal display device according to the First Embodiment.

FIG. 3B is a diagram for explanation of a principle of a self-detection mode in the liquid crystal display device according to the First Embodiment.

FIG. 6A is a diagram for explanation of the Mutual detection mode driving method of the liquid crystal display device according to the First Embodiment.

FIG. 6B is a diagram for explanation of the Mutual detection mode driving method of the liquid crystal display device according to the First Embodiment.

FIG. 7 is an illustration showing a structure of a shift register reviewed prior to reviewing the shift register used in the liquid crystal display device according to the First Embodiment.

FIG. 10 is an illustration showing a structure of the shift register used in the liquid crystal display device according to the First Embodiment.

FIG. 14 is a circuit diagram showing a unit register circuit provided at a subsequent stage of a dummy circuit in the liquid crystal display device according to the Second Embodiment.

FIG. 16 is an illustration showing a configuration of a shift register used in a liquid crystal display device according to a Third Embodiment.

FIG. 18 is a circuit diagram showing a unit register circuit in a liquid crystal display device according to a Fourth Embodiment.

FIG. 19 is a table showing a range of a power supply potential and a clock signal potential supplied to a unit register circuit 31 in the liquid crystal display device according to the Fourth Embodiment.

DETAILED DESCRIPTION

Figure 4:
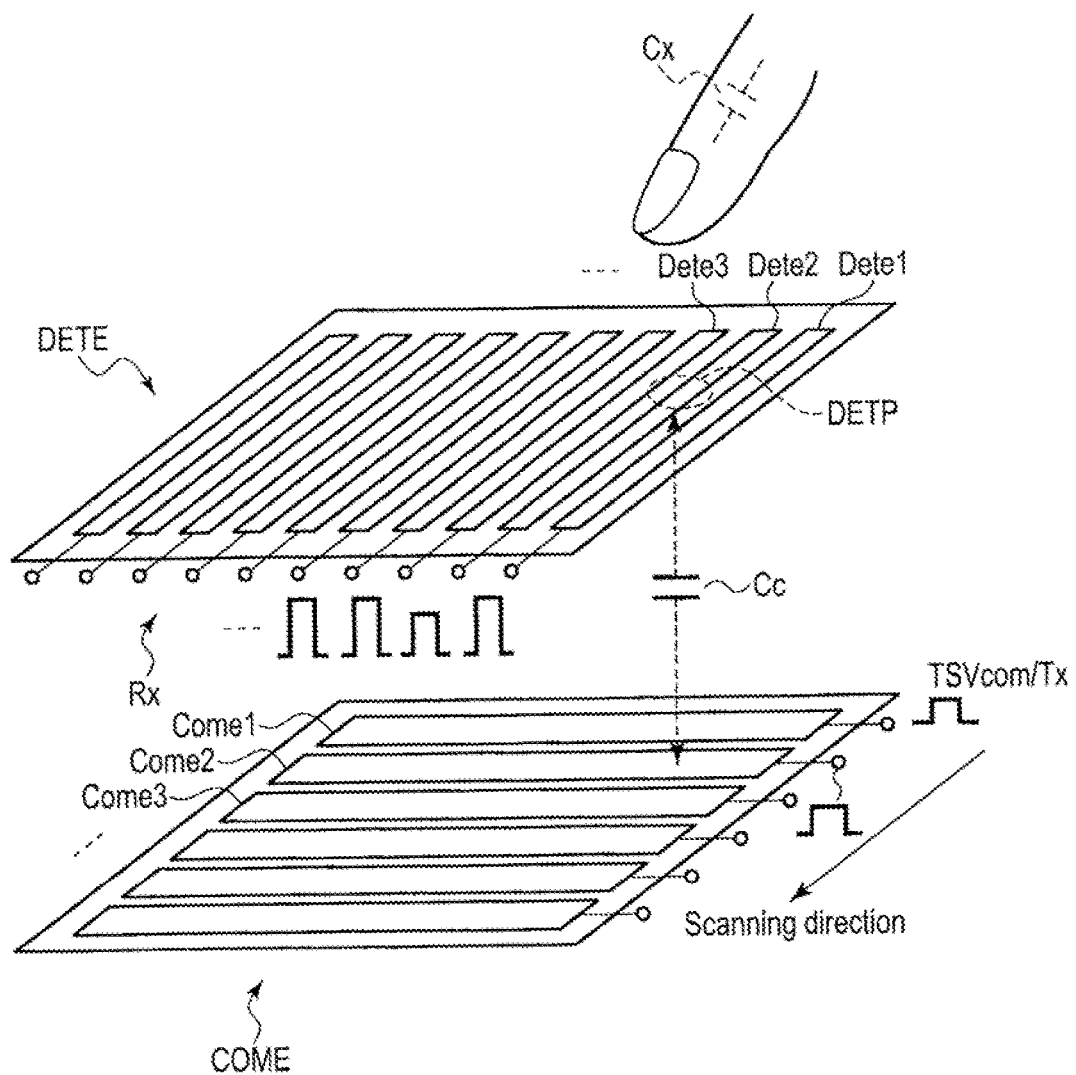
FIG. 4 is an illustration showing a typical basic structure in a Mutual detection mode of the liquid crystal display device according to the First Embodiment.

Various embodiments will be described hereinafter with reference to the accompanying drawings.

In general, according to one embodiment, a display device equipped with a touch detection function, comprising:

a plurality of display elements disposed in a matrix;

a plurality of scanning lines disposed along rows in which the display elements are aligned;

a plurality of signal lines disposed along columns in which the display elements are aligned;

a plurality of switching elements disposed near positions at which the scanning lines and the signal lines intersect; and a plurality of series-connected unit register circuits sequentially outputting scanning signals which set the switching elements connected to the respective scanning lines to be active, wherein a touch detection operation is performed in a scan stop period in which outputting the scanning signals to the scanning lines is stopped, each of the unit register circuits is composed of single-channel transistors, holds the scanning signal output from a previous unit register circuit in an internal circuit, and outputs the scanning signal in a case where a voltage leak of the held signal is equal to or lower than a predetermined value when a predetermined clock signal is input from outside, a dummy unit register circuit which does not drive the scanning line is provided between the unit register circuit at a previous stage which drives a last scanning line before start of the scan stop period and the unit register circuit at a subsequent stage which drives a first scanning line after end of the scan stop period, and the dummy unit register circuit continues outputting the scanning signal to the unit register circuit at the subsequent stage during the scan stop period.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

Each of embodiments will be hereinafter explained with a liquid crystal display device as an example of a display device.

First Embodiment

FIG. 1 is a diagram schematically showing a configuration example of a liquid crystal display device according to a First Embodiment.

The liquid crystal display device according to the First Embodiment comprises an active matrix type liquid crystal display panel LPN. The liquid crystal display panel LPN comprises an array substrate AR serving as a first substrate, a counter-substrate CT serving as a second substrate, which is disposed to be opposed to the array substrate AR, and a liquid crystal layer LQ held between the array substrate AR and the counter-substrate CT. The liquid crystal display panel LPN includes an active area ACT on which an image is displayed. The active area ACT is composed of a plurality of pixels PX arrayed in an m×n matrix where each of m and n is a positive integer.

The liquid crystal display panel LPN includes n scanning lines GL (GL1 to GLn), n auxiliary capacitance lines CL (CL1 to CLn), m signal lines SL (SL1 to SLm), and the like, in the active area ACT. The scanning lines GL and the auxiliary capacitance lines CL extend approximately linearly in, for example, the first direction X. The scanning lines GL and the auxiliary capacitance lines CL are alternately arranged parallel in a second direction Y intersecting the first direction X. The first direction X and the second direction X are approximately orthogonal to each other. The signal lines SL intersect the scanning lines GL and the auxiliary capacitance lines CL.

The signal lines SL extend approximately linearly in the second direction Y. The scanning lines GL, the auxiliary capacitance lines CL, and the signal lines S do not need to extend linearly but may be bent partially.

Each of the scanning lines GL is drawn outside the active area ACT and connected to a scanning line driver GD. Each of the signal line SL is drawn outside the active area ACT and connected to a signal line driver SD. At least some parts of the scanning line driver GD and the signal line driver SD are formed on, for example, an array substrate AR and connected to a controller 2 comprising a driver IC chip.

Each of the pixels PX comprises a switching element SW, a pixel electrode PE, a common electrode COME, and the like. The switching element SW in the First Embodiment has a double-gate structure to reduce a leak current. An auxiliary capacitance Ccs is formed between, for example, the auxiliary capacitance line CL and a drain line (semiconductor layer) of the switching element SW. The auxiliary capacitance line CL is electrically connected to a voltage applying portion (not shown) to which the auxiliary capacitance voltage is applied.

In the First Embodiment, the liquid crystal display panel LPN is configured such that the pixel electrode PE and the common electrode COME are formed on the array substrate AR, and liquid crystal molecules of the liquid crystal layer LQ are switched by mainly using an electric field formed between the pixel electrode PE and the common electrode COME.

The switching element SW is composed of, for example, an n-channel thin film transistor (TFT). The switching element SW is electrically connected with the scanning line GL and the signal line SL. The switching element SW may be a top-gate type switching element or a bottom-gate type switching element. In addition, a semiconductor layer of the switching element SW is formed of, for example, polysilicon but may be formed of amorphous silicon.

The pixel electrode PE is disposed in each of the pixels PX and electrically connected to the switching element SW. The common electrode COME is disposed commonly to the pixel electrodes PE of the pixels PX via the liquid crystal layer LQ. The pixel electrode PE and the common electrode COME are formed of, for example, a transparent conductive material having optical transparency such as Indium-Tin-Oxide (ITO) or Indium-Zinc-Oxide (IZO) but may be formed of the other metal material such as aluminum.

The array substrate AR comprises a power supply unit (not shown) configured to apply a voltage to the common electrode COME. The power supply unit is formed outside, for example, the active area ACT. The common electrode COME is drawn to the outside of the active area ACT and electrically connected with the power supply unit via a conductive member (not shown).

The liquid crystal display device according to the First Embodiment comprises a touch detection function. Self detection mode and Mutual detection mode will be explained as modes of detecting the touch position of the liquid crystal display device according to the First Embodiment.

<Self Detection Mode>

FIG. 2 and FIG. 3 are illustrations for explanation of a principle of the Self detection mode in the liquid crystal display device according to the First Embodiment.

FIG. 2 shows a state in which a user's finger is not in contact with the touch panel. FIG. 2A shows a state in which a power source Vdd and a detection electrode DETE are connected by a control switch SWc, and the detection electrode DETE is not connected to a capacitor Ccr. In this state, a capacitance Cx1 of the detection electrode DETE is charged. FIG. 2B shows a state in which the power source Vdd and the detection electrode DETE are disconnected and the detection electrode DETE and the capacitor Ccr are connected, by the control switch SWc. In this state, charges of the capacitance Cx1 are discharged via the capacitor Ccr.

FIG. 3 shows a state in which the user's finger is in contact with the touch panel. FIG. 3A shows a state in which the power source Vdd and the detection electrode DETE are connected by the control switch SWc, and the detection electrode DETE is not connected to the capacitor Ccr. In this state, not only the capacitance Cx1 of the detection electrode DETE, but also a capacitance Cx2 generated by the user's finger close to the detection electrode DETE are charged. FIG. 3B shows a state in which the power source Vdd and the detection electrode DETE are disconnected and the detection electrode DETE and the capacitor Ccr are connected, by the control switch SWc. In this state, charges of the capacitance Cx1 and the capacitance Cx2 are discharged via the capacitor Ccr.

A voltage variation characteristic of the capacitance Ccr at the discharge shown in FIG. 3B (state of the finger in contact with the panel) is apparently different from a voltage variation characteristic of the capacitance Ccr at the discharge shown in FIG. 2B (state of the finger out of contact with the panel) since the capacitance Cx2 exists. In the Self detection mode, finger's operation input is therefore determined by using a feature that the voltage variation characteristic of the capacitance Ccr is different due to presence or absence of the capacitance Cx2.

Mutual Detection Mode>

FIG. 4 is an illustration showing a typical basic structure in a Mutual detection mode of the liquid crystal display device according to the First Embodiment. The common electrode COME and the detection electrode DETE are used. The common electrode COME includes a plurality of stripe-shaped common electrodes Come1, Come2, Come1, . . . . The stripe-shaped common electrodes Come1, Come2, Come3, . . . are arranged in the scanning (driving) direction (Y direction or X direction).

In contrast, the detection electrode DETE includes a plurality of stripe-shaped detection electrodes Dete1, Dete2, Dete3, . . . (narrower than the stripe-shaped common electrodes). The stripe-shaped detection electrodes Dete1, Dete2, Dete3, . . . are arranged in a direction (Y direction or X direction) orthogonal to the stripe-shaped common electrodes Come1, Come2, Come3, . . . .

The common electrode COME and the detection electrode DETE are arranged while longitudinally spaced apart. For this reason, the capacitance Cc exists between the stripe-shaped common electrodes Come1, Come2, Come3, . . . and the stripe-shaped detection electrodes Dete1, Dete2, Dete3, . . . .

The stripe-shaped common electrodes Come1, Come2, Come3, . . . are scanned in a predetermined cycle by drive pulses Tx. It is assumed that the user's finger exists close to the stripe-shaped detection electrode Dete2. Then, when the drive pulse Tx is supplied to the stripe-shaped common electrode Come2, a pulse of a level lower than pulses obtained from the other stripe-shaped detection electrodes can be obtained from the stripe-shaped detection electrode Dete2.

The capacitance Cx represented by the finger in a case where the user's finger is close to the detection electrode DETE is different from that in a case where the user's finger is remote from the detection electrode DETE. For this reason, the level of the detection pulse Rx in a case where the user's finger is close to the defection electrode DETE is different from that in a case where the user's finger is remote from the detection electrode DETE. The proximity of the finger to the plane of the touch panel can be therefore determined based on the level of the detection pulse Rx. Of course, a two-dimensional position of the finger on the plane of the touch panel can be detected based on the electrode drive timing of the drive pulse Tx and the output timing of the detection pulse Rx.

Figure 5B:
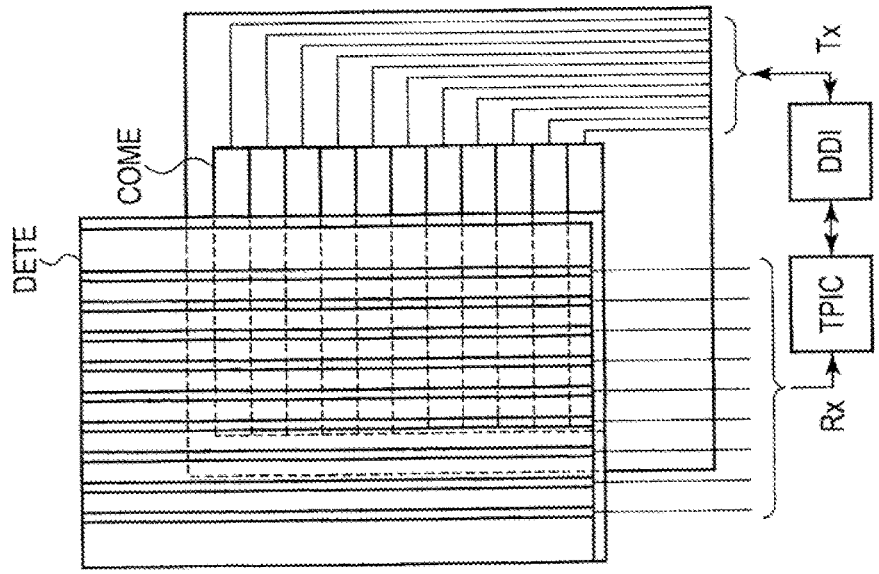
FIG. 5B is a diagram showing a schematic structure of the sensor in the liquid crystal display device according to the First Embodiment.
Figure 5A:
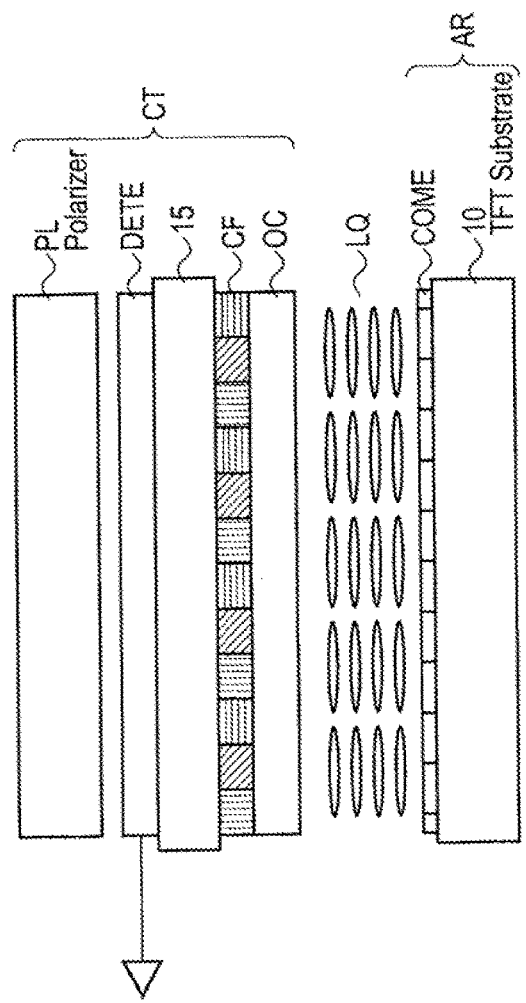
FIG. 5A is a diagram showing a schematic structure of a sensor in the liquid crystal display device according to the First Embodiment.

FIG. 5 shows a schematic structure of a sensor in the liquid crystal display device according to the First Embodiment. FIG. 5A is a cross-sectional view showing the liquid crystal display device while FIG. 5B is a plan view showing the structure of the sensor.

As shown in FIG. 5A, the liquid crystal display device comprises an array substrate AR, a counter-substrate CT, and a liquid crystal layer LQ held between the array substrate AR and the counter-substrate CT.

To simplify the following explanations, the stripe-shaped common electrodes Come1, Come2, Come3, . . . are represented as the common electrode COME. In addition, the stripe-shaped detection electrodes Dete1, Dete2, Dete3, . . . are represented as the detection electrode DETE.

The array substrate AR comprises a TFT substrate 10 and the common electrode COME. The TFT substrate 10 comprises a transparent insulating substrate formed of glass or the like, a switching element (not shown), various lines such as a signal line SL and a scanning line GL, and a planarizing layer serving as an insulating film which covers these elements. The common electrode COME is located on the TFT substrate 10 and covered with an insulating layer. The common electrode COME is also used as a driving electrode for sensor. In the First Embodiment, the common electrode COME extends in the same direction as a direction of extension of the scanning line GL.

The counter-substrate CT comprises a transparent insulating substrate 15 formed of glass or the like, a color filter CF, the detection electrode DETE, and a polarizer PL. The color filter CF is disposed on the transparent insulating substrate 15. The color filter CF is covered with the overcoat layer OC. The detection electrode DETE is located on a main surface of the outside of the transparent insulating substrate 15 (i.e., the side opposite to the color filter CF). The detection electrode DETE extends in a direction (second direction) approximately orthogonal to a direction (first direction) of extension of the common electrode COME and is disposed in the shape of stripes arranged in the first direction. The detection electrode DETE is formed of, for example, a transparent conductive material such as ITO or IZO. The polarizer PL is disposed on the detection electrode DETE (on the side of the transparent insulating substrate 15 opposite to the color filter CF).

FIG. 5B is a view for explanation of a configuration example of the common electrode COME and the detection electrode DETE. In the liquid crystal display device according to the First Embodiment, a touch driver TPIC and a display driver DDI cooperate with each other such that the drive pulse Tx is input to the common electrode COME and the detection pulse Rx is obtained from the detection electrode DETE. The display driver DDI outputs the drive pulse Tx, and the touch driver TPIC recognizes the finger's contact position from the position of the common electrode COME inputting the drive pulse Tx and the waveform of the detection pulse Rx. Calculation of the touch position can be configured to be performed by an external device (not shown).

FIG. 6 is a diagram for explanation of the Mutual detection mode driving method of the liquid crystal display device according to the First Embodiment.

A drive unit electrode Tu of the common electrode COME is shown in FIG. 6A. Each of the drive unit electrodes Tu1, . . . TuN is composed of a plurality of continuous stripe-shaped common electrodes Come. A video display operation and a touch position detection operation are driven by time sharing since the common electrode COME used for video display is also used as a drive electrode for touch position detection as explained above.

In the driving mode shown in FIG. 6B, one frame period is composed of a plurality of units. One unit is divided into a period for displaying video and a period for detecting the touch position. One frame period is formed by alternately repeating the divided video display periods and the divided touch position detection periods. After an operation of outputting a video signal (SIGn) for each color in accordance with a signal (SELR/G/B) for selecting three colors of RGB is performed for a plurality of video display rows, Mutual detection operation of inputting the drive pulses Tx to the drive unit electrodes Tu (stripe-shaped common electrodes Come) is performed. The above operation is sequentially repeated at the divided video display rows and the drive unit electrodes Tu (Tu1, . . . , TuN).

Next, a structure and an operation of the shift register used in the liquid crystal display device according to the First Embodiment will be explained.

FIG. 7 is an illustration showing a structure of the shift register reviewed prior to reviewing the shift register used in the liquid crystal display device according to the First Embodiment.

A shift register 30 is composed of series-connected unit register circuits 30 at a plurality of stages. The unit register circuits 31 at the respective stages sequentially transfer trigger signals ST input synchronously with clock signals CK1 to CK4 which are pulse signals to the unit register circuits 31 at the subsequent stages and sequentially output gate signals G1 to Gn which are pulse signals synchronously with the transfer operations.

The shift register 30 is composed to be driven with four-phase clock signals CK1 to CK4, and pulses having a width of 1H (one horizontal drive period) are sequentially output from the respective clock signals CK1 to CK4. In other words, the clock signals CK1 to CK4 are repeatedly generated in a cycle of 4H (four horizontal drive periods). More specifically, the clock signals are generated in order of CK1, CK2, CK3, CK4, CK1, . . . , and supplied to the unit register circuits 31 at the respective stages. The unit register circuit 31 at each stage is associated with the clock signals of two phases, of the clock signals of plural phases.

In FIG. 7, three signal terminals corresponding to the input/output signals are provided at a left side of a square block indicating the unit register circuit 31. The input/output signals connected to three signals mentioned above will be explained with examples from the unit register circuit 31 at the first stage to j-th unit register circuit 31 (j). The output signal (gate signal G) is input to the signal terminal at the upper position from the unit register circuit 31 (j−1) at the previous stage. If the unit register circuit 31 (j) is a circuit at the first stage, the trigger signal ST is input to the signal terminal at the upper position. The gate signal G which is the output signal is output from the signal terminal at a middle position. This output signal becomes an input signal to a unit register circuit 31 (j+1) at the subsequent stage. The output signal (gate signal G) is input to the signal terminal at a lower position from the unit register circuit 31 (j+2) at the second sequent stage.

Two signal terminals corresponding to the clock signals are provided at a right side of the square block indicating the unit register circuit 31. If four clock signals are denoted by CK1, CK2, CK3, and CK4, for example, the clock signals CK1, CK2, CK3, CK4, CK1 . . . are input to the signal terminals at the upper position of the unit register circuits 31 at the first stage, second stage, third stage, . . . , respectively. Then, the clock signals CK3, CK4, CK1, CK2, CK3, . . . proceeding from the clock signals at the upper position by two positions are input to the signal terminals at the lower position of the unit register circuits 31 at the first stage, second stage, third stage, . . . .

The trigger signal ST and the clock signals CK1 to CK4 to operate the sift register 30 are output from the controller 2 comprising the driver IC chip. Power supply voltages (high voltage VGH and low voltage VGL) are output from the power supply unit (not shown).

Figure 8:
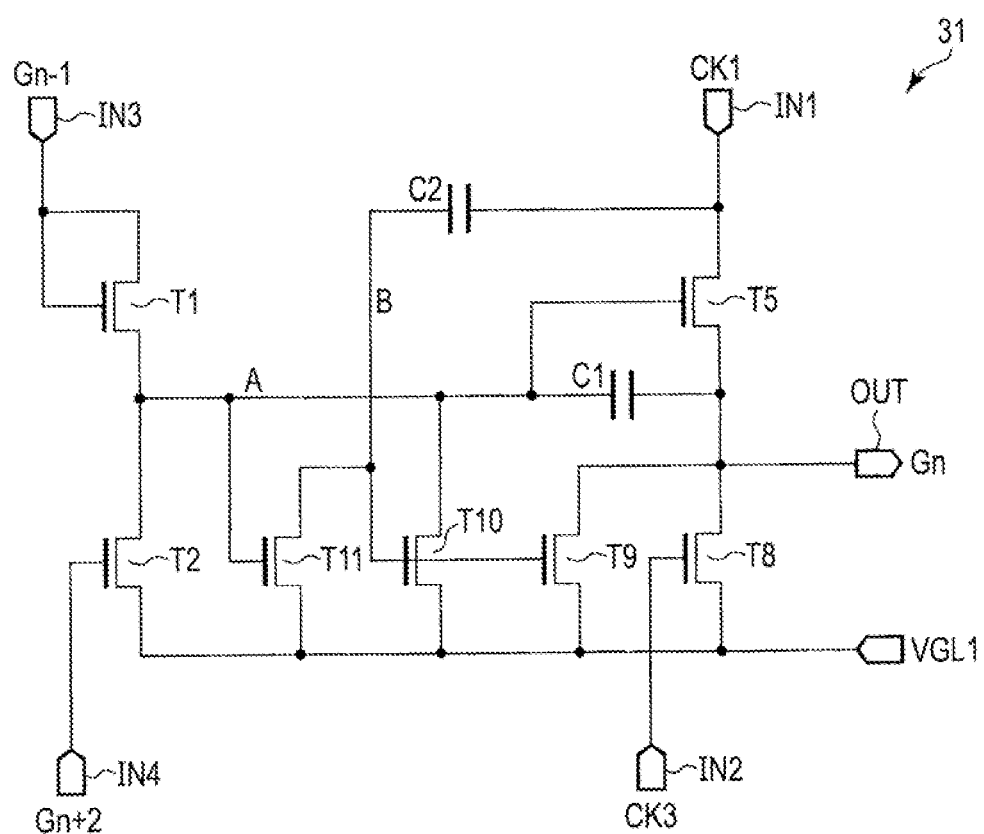
FIG. 8 is a circuit diagram showing a unit register circuit reviewed prior to reviewing the shift register used in the liquid crystal display device according to the First Embodiment.

FIG. 8 is a circuit diagram showing the unit register circuit 31 reviewed prior to reviewing the shift register used in the liquid crystal display device according to the First Embodiment. FIG. 8 shows the unit register circuit 31 at the n-th stage.

The unit register circuit 31 is configured to comprise n-channel transistors T1, T2, T5, T8, T9, T10, and T11 and capacitors C1 and C2. Each of the transistors is TFT using an oxide semiconductor. In addition, each of the n-channel transistors is turned on (i.e., source and drain terminals become electrically conductive) if an H (High) level voltage is applied to a gate terminal of the transistor and turned off ((i.e., source and drain terminals become electrically disconnected) if an L (Low) level voltage is applied to the gate terminal.

The unit register circuit 31 at the n-th stage comprises an output terminal DOT which outputs a gate signal Gn at the n-th stage. In addition, the unit register circuit 31 at the n-th stage comprises IN1 and IN2 as two input terminals to which the clock signals are input, IN3 as an input terminal to which the trigger signal representing a start time of the output operation period is input, and IN4 as an input terminal to which the trigger signal representing the end time is input. The clock signal (CK1) is input to the input terminal IN1 while the clock signal (CK3) is input to the input terminal IN2. The gate signal G (n−1) is input from the unit register circuit 31 at the (n−1)th stage that is the previous stage to the input terminal IN3 while the gate signal G (n+2) is input from the unit register circuit 31 at the (n+2)-th stage that is the subsequent stage to the input terminal IN4. The trigger signal ST is input from the controller to the input terminal IN3 of the unit register circuit 31 at the first stage.

The transistors T1, T2, and, T5 and the capacitor C1 constitute an output circuit which outputs the gate signal Gn as the drive signal from the output terminal OUT. The transistor T1 has the drain and the gate electrically connected (diode-connected), and functions as a hold circuit which urges node A electrically connected to the gate of the transistor T5 to hold the high voltage of the gate signal G (n−1). If the gate signal G (n−1) at the (n−1)-th stage is input to the input terminal IN3, the transistor T1 holds the node A at H level.

The transistor 12 functions as a switch element which switches supply of a low power scarce voltage VGL (VGL1) to the node A. The gate of the transistor 2 is connected to the input terminal IN4 and, if the gate signal G (n+2) at the (n+2)-th stage is input to the input terminal IN4, the transistor T2 is turned on, supplies the low power source voltage VGL1 to the node A and sets the node A at L level.

The transistor T5 has the drain connected to the input terminal IN1 and the source connected to the output terminal OUT. The capacitor C1 is connected between the gate and the source of the transistor T5. The transistor T5 is turned on in a period (output operation period) in which the node A becomes H level, and takes in a clock pulse output as the clock signal CK1 in this period from the input terminal IN1 and outputs the clock pulse to the output terminal OUT as the gate signal Gn.

Not only the transistor T5, but also Transistors T8 and T9 are connected to the output terminal OUT. Each of the transistors T8 and T9 is an output terminal switch which switches supply of the low power source voltage VGL1 to the output terminal OUT. The transistor T8 has the drain connected to the output terminal OUT and the scarce connected to the low power source voltage VGL1. Turning on/off the transistor T8 is controlled in accordance with an electric potential of the clock signal CK3 from the input terminal IN2 connected to the gate. The transistor T9 has the drain connected to the output terminal OUT and the source connected to the low power source voltage VGL1. Turning on/off the transistor T9 is controlled in accordance with an electric potential of the node B connected to the gate.

The transistor T10 functions as a switch element which switches supply of the low power source voltage VGL1 to the node A. The transistor T10 has the gate connected to the node B and turning on/off the transistor T10 is controlled in accordance with the electric potential of the node B connected to the gate. The transistor T11 functions as a switch element which switches supply of the low power source voltage VGL1 to the node B. The gate of the transistor T11 is connected no the node A and, if the node A is set at the H level, the node B is set at the L level.

A capacitor C2 is connected between the input terminal IN1 and the node B. If the clock signal CK1 is input to the input terminal IN1 in a state in which the unit register circuit 31 at the n-th stage does not output the gate signal Gn to the output terminal OUT, the electric potential of the node B is made high via the capacitor C2, the transistor T10 is operated, and the electric potential of the node A is made to be held at the electric potential of the low power source voltage VGL1.

Next, operations of the unit register circuit 31 shown in FIG. 8 will be explained.

The unit register circuits 31 constituting the shift register sequentially generate output pulses which are the gate signals G. If the H-level gate signal G (n−1) is input to the input terminal IN3 of the unit register circuit 31 at the n-th stage from the previous stage, the source terminal of the transistor T1, i.e., the electric potential of the node A is held at the H level since the transistor T1 is diode-connected. As a result, the transistor T5 is turned on. In the state in which the node A is at the H level, the transistor T11 is turned on, the low power source voltage VGL1 is supplied to the node B, the electric potential of the node B becomes L level, and the transistors T9 and T10 are turned off.

The electric potential of the output terminal OUT is determined in accordance with the clock signal OKI in the period of the above state (output operation period). In other words, if the H-level pulse of the clock signal CK1 is input to the input terminal IN1, the electric potential of the node A is further raised via the capacitor C1 connected between the source and the gate of the transistor T5 by the bootstrap effect. Then, the H-level gate signal G(n) is generated at the output terminal OUT.

The gats signal G (n) at the n-th stage is input to the unit register circuit 31 at the (n+1)-th stage, and the unit register circuit operates similarly to that at the n-th stage and generates the gate signal G (n+1) by synchronizing with the pulse of the clock signal CK2. Furthermore, the unit register circuit 31 at the (n+2)-th stage generates the gate signal G (n+2) by synchronizing with the pulse of the clock signal CK3.

In the unit register circuit 31 at the n-th stage, if the H-level gate signal G (n+2) is input from the (n+2)-th stage to the input terminal IN4, the transistor T2 is turned on, the low power source voltage VGL1 is supplied to the node A, and the node A becomes L level again. Simultaneously, the transistor T8 is turned on by the pulse of the clock signal CK3 which is input to the input terminal IN2, the low power source voltage VGL1 is supplied to the source of the transistor T5 and the electric potentials of both of the ends of the capacitor C1 become L level. In this state, the electric potential of the output terminal OUT is set to the L level supplied by the low power source voltage VGL1.

The pulse of the clock signal CK1 is applied to the drain of T5 even in a period other than the output operation period, and this pulse acts to urge the electric potential of the node A to rise via the gate-drain capacitance of T5. The B level of the node B is applied to the gate terminal in a period other than the output operation period, the transistor T10 thereby becomes turned on and prevents rising of the electric potential (increase in floating potential) of the node A by supplying the low power source voltage VGL1 to the node A.

Figure 9:
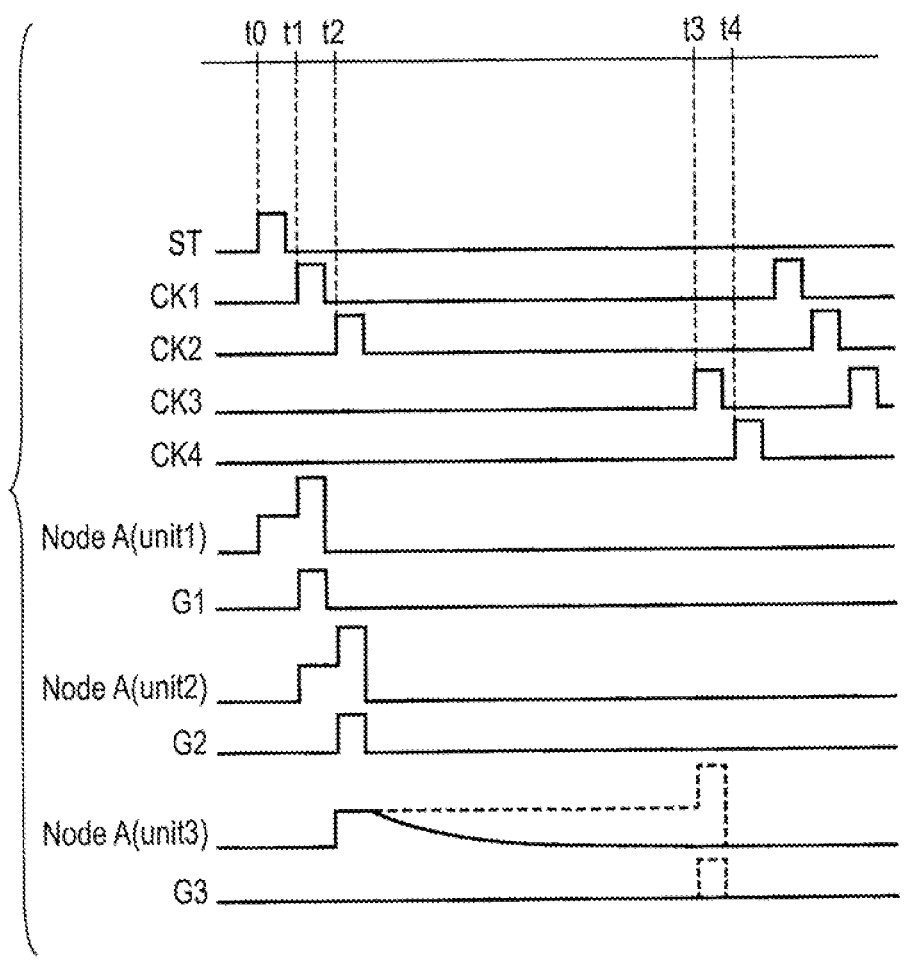
FIG. 9 is a timing chart for explanation of a current leak in the unit register circuit reviewed prior to reviewing the shift register used in the liquid crystal display device according to the First Embodiment.

FIG. 9 is a timing chart for explanation of a current leak in the unit register circuit 31 reviewed prior to reviewing the shift register used in the liquid crystal display device according to the First Embodiment. The contents explained here are applied to a case where since a current leaks from the transistor in a period in which driving the scanning line is temporarily stopped, driving the scanning line cannot be restarted and driving the scanning line is stopped as explained above.

FIG. 9 shows progression of the input/output signals (ST, CK1 to CK4, and G1 to G3) and the variation in the node A potential at each time (t0, t1, t2, . . . ) in three unit register circuits 31 at the first to third stages.

At time t0, when the controller 2 outputs the trigger signal ST, the electric potential of the node A in the unit register circuit 31 at the first stage which inputs the trigger signal ST becomes H level. At time t1, when the controller 2 outputs the clock signal CK1, the electric potential of the node A further rises by the bootstrap effect. The clock signal CK1 having no potential drop is thereby output as the gate signal G1.

In contrast, the electric potential of the node A in the unit register circuit 31 at the second stage which inputs the gate signal G1 at time t1 becomes H level. At time t2, when the controller 2 outputs the clock signal CK2, the electric potential of the node A further rises by the bootstrap effect. The clock signal CK2 having no potential drop is thereby output as the gate signal G2.

The electric potential of the node A in the unit register circuit 31 at the third stage which inputs the gate signal G2 at time t2 becomes H level. Since the scan stop period is started in this state, driving the scanning line is temporarily stopped. Thus, the node A is left in the floating state during the scan stop period after the gate signal G2 becomes L level. Since the transistor in the unit register circuit 31 is composed of the single channel, a leak current flows from the node A via the transistors T2, T10, and T11. As a result, the electric potential of the node A is reduced as indicated a solid line during the scan stop period.

The scan stop period is ended and the controller 2 outputs the clock signal CK3 at time t3. The clock signal CK3 having no potential drop caused by the bootstrap effect is output as the gate signal G3 in a state in which the leak does not occur and the electric potential of the node A in the unit register circuit 31 is maintained at H level (i.e., the state indicated by a dotted line in the chart). In a state in which the leak occurs and the electric potential of the node A in the unit register circuit 31 is lowered (i.e., the state indicated by a solid line in the chart), however, the scanning line driving operation is not restarted and the display operation is stopped since the gate signal G3 is not output from the unit register circuit 31 at the third stage.

Next, the liquid crystal display device of the First Embodiment will be described.

FIG. 10 is an illustration showing a configuration of the shift register used in the liquid crystal display device according to the First Embodiment. In FIG. 10, the configuration of the shift register shown in FIG. 7 is shown in a simple form.

The shift register used in the liquid crystal display device according to the First Embodiment comprises a dummy unit register circuit 31 which does not drive the scanning line between the unit register circuit 31 which drives the scanning line immediately before the scan stop period is started and the unit register circuit 31 which drives the scanning line immediately after the scan stop period is ended. In other words, the connection form of the clock signals (CK1 to CK4), the gate signals G, and the like in the unit register circuits 31 is the same as the connection form shown in FIG. 7, but the output of the unit register circuit set as a dummy is not connected to the scanning line.

In other words, in the shift register shown in FIG. 10, the output signals of the unit register circuits 31 at the first and second stages drive the scanning lines as the gate signals G1 and G2, respectively, but the output signal of the unit register circuit 31 at the third stage does not drive the scanning lines. The output signals of the unit register circuits 31 at the fourth and fifth stages drive the scanning lines as the gate signals G3 and G4, respectively.

The circuit configuration of the unit register circuits 31 of the shift register used in the liquid crystal display device according to the First Embodiment is the same as the circuit configuration shown in FIG. 8 irrespective of whether the unit register circuit is a dummy or not. Its detailed explanations are therefore omitted.

Figure 11:
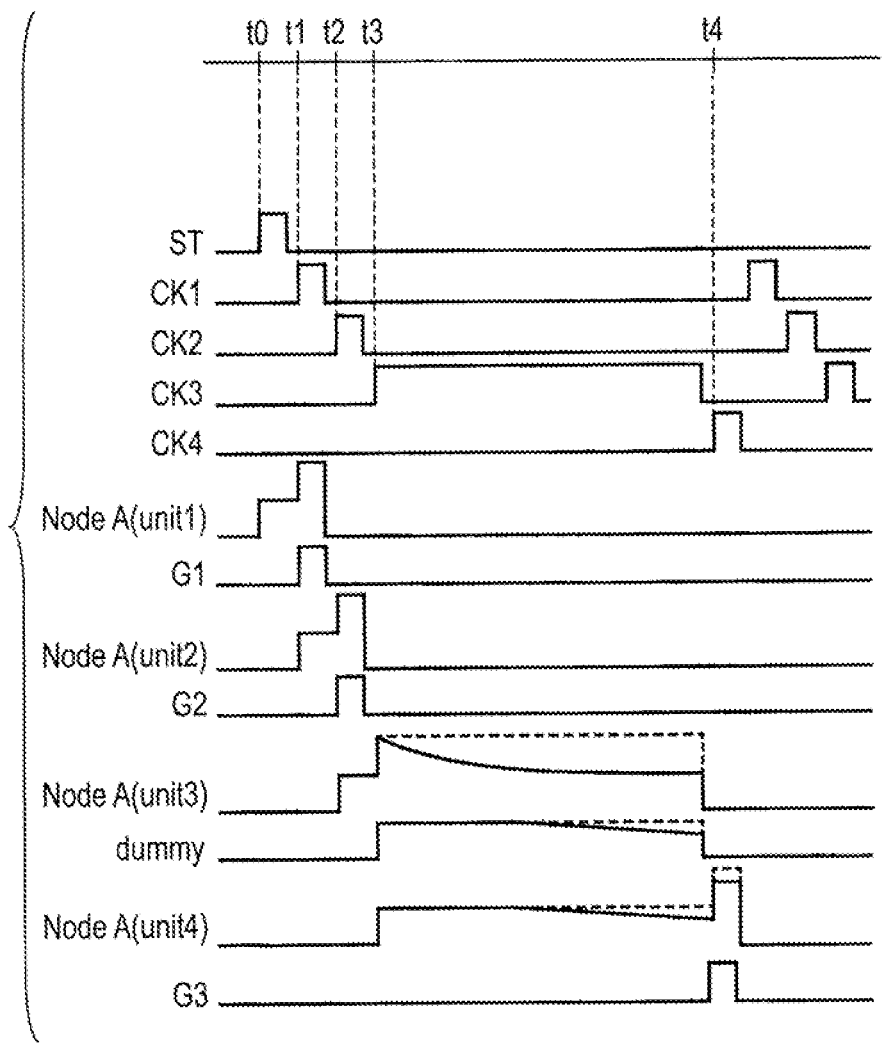
FIG. 11 is a timing chart showing an operation of the shift register in the liquid crystal display device according to the First Embodiment.

FIG. 11 is a timing chart showing an operation of the shift register in the liquid crystal display device according to the First Embodiment. FIG. 11 shows progression of the input/output signals (ST, CK1 to CK4, and G1 to G3) and the variation in the node A potential at each time (t0, t1, t2, . . . ) in four unit register circuits 31 including a dummy at the first to fourth stages.

At time t0, when the controller 2 outputs the trigger signal ST, the electric potential of the node A in the unit register circuit 31 at the first stage to which the trigger signal ST is input becomes H level. At time t1, when the controller 2 outputs the clock signal CK1, the electric potential of the node A further rises by the bootstrap effect. The clock signal CK1 having no potential drop is thereby output as the gate signal G1.

In contrast, the electric potential of the node A in the unit register circuit 31 at the second stage to which the gate signal G1 is input at time t1 becomes H level. At time t2, when the controller 2 outputs the clock signal CK2, the electric potential of the node A further rises by the bootstrap effect. The clock signal CK2 having no potential drop is thereby output as the gate signal G2.

The electric potential of the node A in the unit register circuit 31 at the third stage (dummy) to which the gate signal G2 is input at time t2 becomes H level. In this state, the scan stop period is started and driving the scanning line is temporarily stopped. At time t3, when the controller 2 outputs the clock signal CK3 which maintains the H level during the scan stop period, the electric potential of the node A further rises by the bootstrap effect. For this reason, the clock signal CK3 having no potential drop is output as a dummy signal dummy. In addition, at time t3, the electric potential of the node A in the unit register circuit 31 at the fourth stage to which the dummy signal dummy is input becomes H level.

Since the clock signal CK3 maintains H level during the scan stop period, reduction in the electric potential of the node A in the unit register circuit 31 at the third stage (dummy) during the scan stop period, which is caused by the leak current, is suppressed (in a state indicated by a solid line in the chart). In addition, reduction in the electric potential of the dummy signal dummy which occurs with the reduction in the electric potential of the node A caused by the leak current is also suppressed (in a state indicated by the solid line in the chart). As a result, reduction in the electric potential of the node A in the unit register circuit 31 at the fourth stage during the scan stop period is also suppressed.

At time t4 after the end of the scan stop period, when the controller 2 outputs the clock signal CK4, the electric potential of the node A in the unit register circuit 31 at the fourth stage further rises by the bootstrap effect. The clock signal CK4 having no potential drop is thereby output to the gate signal G3 and the display operation can be restarted.

The First Embodiment comprises a dummy unit register circuit 31 which does not drive the scanning line between the unit register circuit 31 which drives the scanning line immediately before the scan stop period and the unit register circuit 31 which drives the scanning line immediately after the scan stop period, and can restart the scan drive after the end of the scan stop period by constituting the dummy circuit to continue outputting the H level signal to the unit register circuit 31 at the subsequent stage during the scan stop period.

[Variation of Unit Register Circuit]

Figure 12:
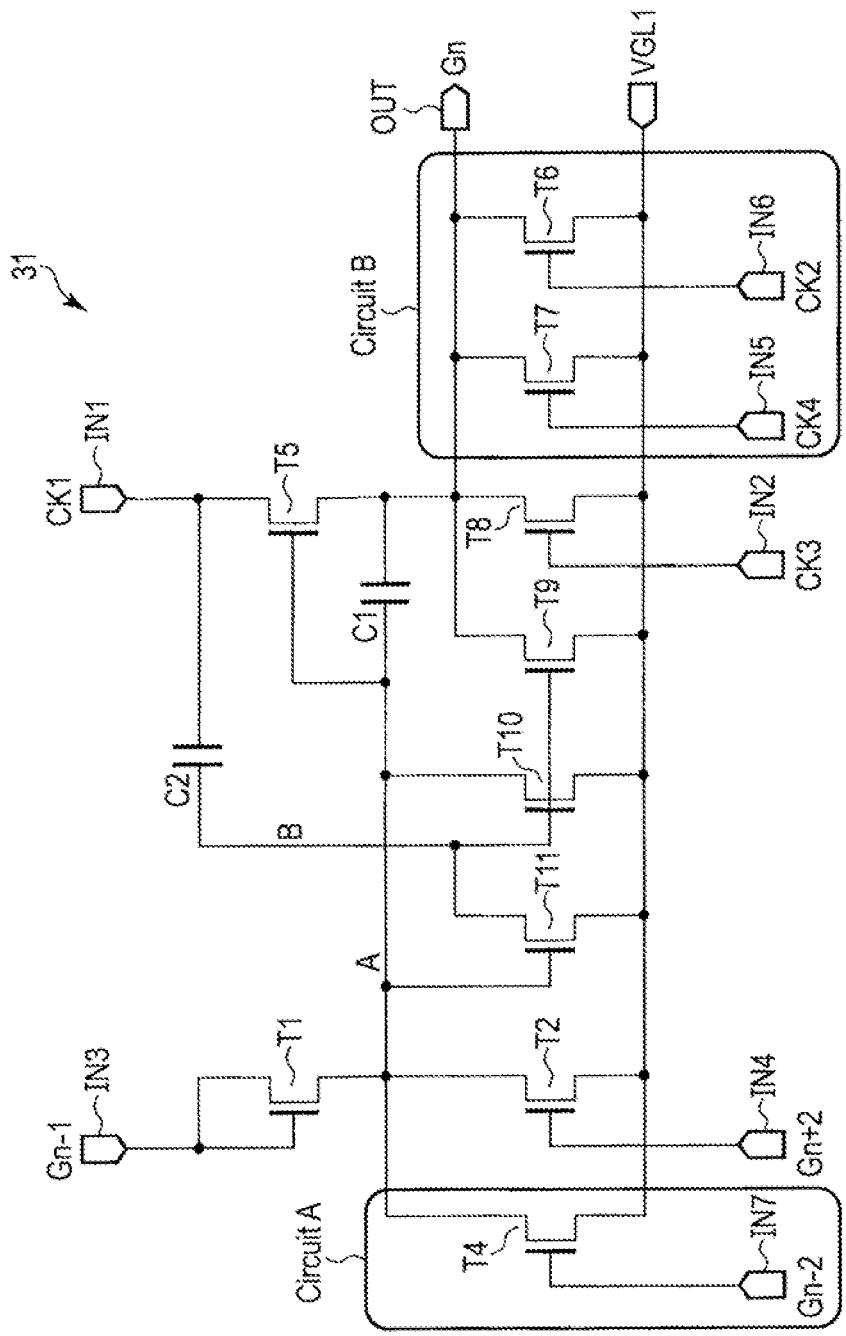
FIG. 12 is a circuit diagram showing a variation of a unit register circuit 31 used in the liquid crystal display device according to the First Embodiment.

FIG. 12 is a circuit diagram showing a variation of the unit register circuit 31 used in the liquid crystal display device according to the First Embodiment. A circuit A and/or a circuit B is added to the circuit of the above-explained unit register circuit 31. In FIG. 12, the unit register circuit 31 which outputs the gate signal Gn by the clock CK1 will be explained as an example.

In the circuit A, transistor T4 is added to the unit register circuit 31. A drain of the transistor T4 is connected to the drain (node A) of the transistor T2, and a source of the transistor T4 is connected to the source of the transistor T2 and supplied with (low power source voltage VGL1). The gate signal G (n−2) is input from the unit register circuit 31 at the (n−2)-th stage to a gate of the transistor T4 via an input terminal IN7.

By providing the circuit A, the node A can be reset to L level by inputting the gate signal G (n−2) to the input terminal IN7 before the gate signal G (n−1) which sets the node A to the H level is input from the unit register circuit 31 at the (n−1)-th stage to the input terminal IN4, and a stable circuit operation can be implemented.

In the circuit B, transistor T6 and/or transistor T7 is added to the unit register circuit 31. A drain of the transistor T6 (T7) is connected to the drain (output terminal OUT) of the transistor T8, and a source of the transistor T6 (T7) is connected to the source of the transistor T8 and supplied with the low power source voltage VGL1. The clock signal CK2 (CK4) is input to a gate of the transistor T6 (T7) via input terminal IN6 (IN5).

By providing the circuit B, the electric potential of the output terminal OUT can be reset to L level except the timing at which the clock signal CK1 is input, i.e., the timing at which the gate signal G (n) is output, and a stable circuit operation can be implemented.

Second Embodiment

The Second Embodiment is different from the First Embodiment with respect to a feature that a unit register circuit 31 provided at a stage subsequent with a dummy circuit is configured to limit timing of taking a dummy signal dummy in its own circuit. Parts which are the same as or similar to the First Embodiment are denoted by the same reference numerals and their detailed explanations are omitted.

Figure 13:
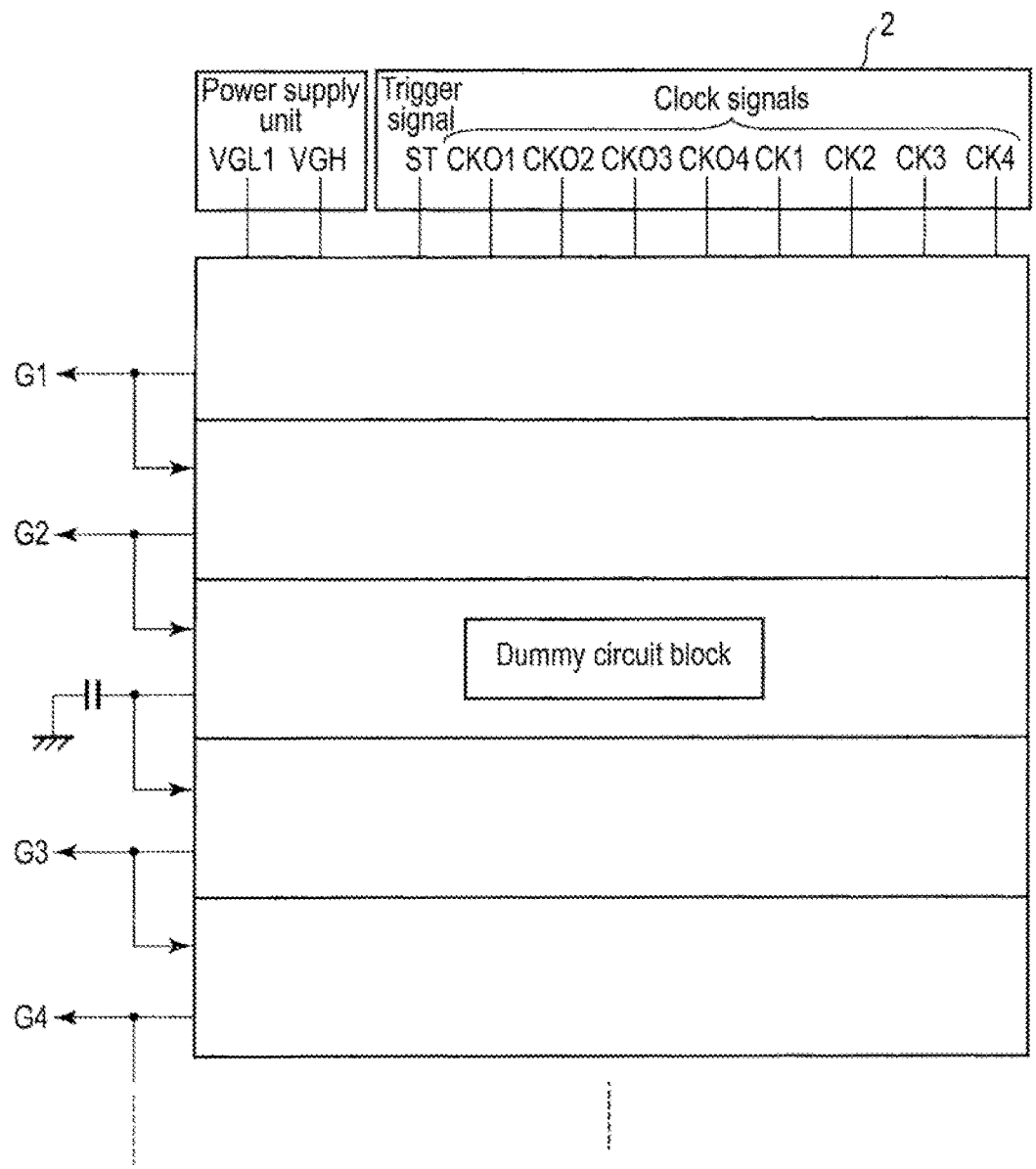
FIG. 13 is an illustration showing a structure of a shift register used in a liquid crystal display device according to a Second Embodiment.

FIG. 13 is an illustration showing a configuration of a shift register used in a liquid crystal display device according to the Second Embodiment. In FIG. 13, the configuration of the shift register shown in FIG. 7 is shown in a simple form, similarly to FIG. 10.

The shift register used in the liquid crystal display device according to the Second Embodiment comprises a dummy unit register circuit 31 which does not drive a scanning line, between a unit register circuit 31 which drives the scanning line immediately before a scan stop period and a unit register circuit 31 which drives the scanning line immediately after the scan stop period, similarly to the First Embodiment. In addition, the Second Embodiment comprises newly added clock signals (CKO1 to CKO4). The clock signals (CKO1 to CKO4) are signals added to a drain of a transistor T5 via an input terminal IN1.

FIG. 14 is a circuit diagram showing the unit register circuit 31 provided at a subsequent stage of a dummy circuit in the liquid crystal display device according to the Second Embodiment. A circuit of the unit register circuit 31 is different from the circuit shown in FIG. 8 with respect to parts represented as circuits C and D. Names of the clock signals shown in FIG. 14 are the names corresponding to a timing chart shown in FIG. 15 which will be explained later.

In the circuit C, transistor T13 is provided between an input terminal IN3 and a transistor T1. In other words, the transistor 13 has a drain connected to the input terminal IN3 and a source connected to a drain of the transistor T1. The clock signal CK3 is input to a gate of the transistor T13.

In the circuit C, when the transistor T13 is turned on, a node A is held at H level if an output signal G at a previous stage becomes H level. When the transistor T13 is turned off, however, the nods A is not held at H level even if the output signal G at the previous stage becomes H level. Therefore, it can be controlled whether the output signal G at the previous stage input from the input terminal IN3 is taken in or not by providing the circuit C.

In the circuit D, transistor T12 is provided instead of a transistor T2 shown in FIG. 12. In other words, the transistor T12 has a drain connected to the node A and a source to which the low power source voltage VGL1 is input. A clock signal CK2 is input to a gate of the transistor T12 instead of a gate signal G at a second back stage. The configuration of the shift register can be therefore simplified by providing the circuit D.

Figure 15:
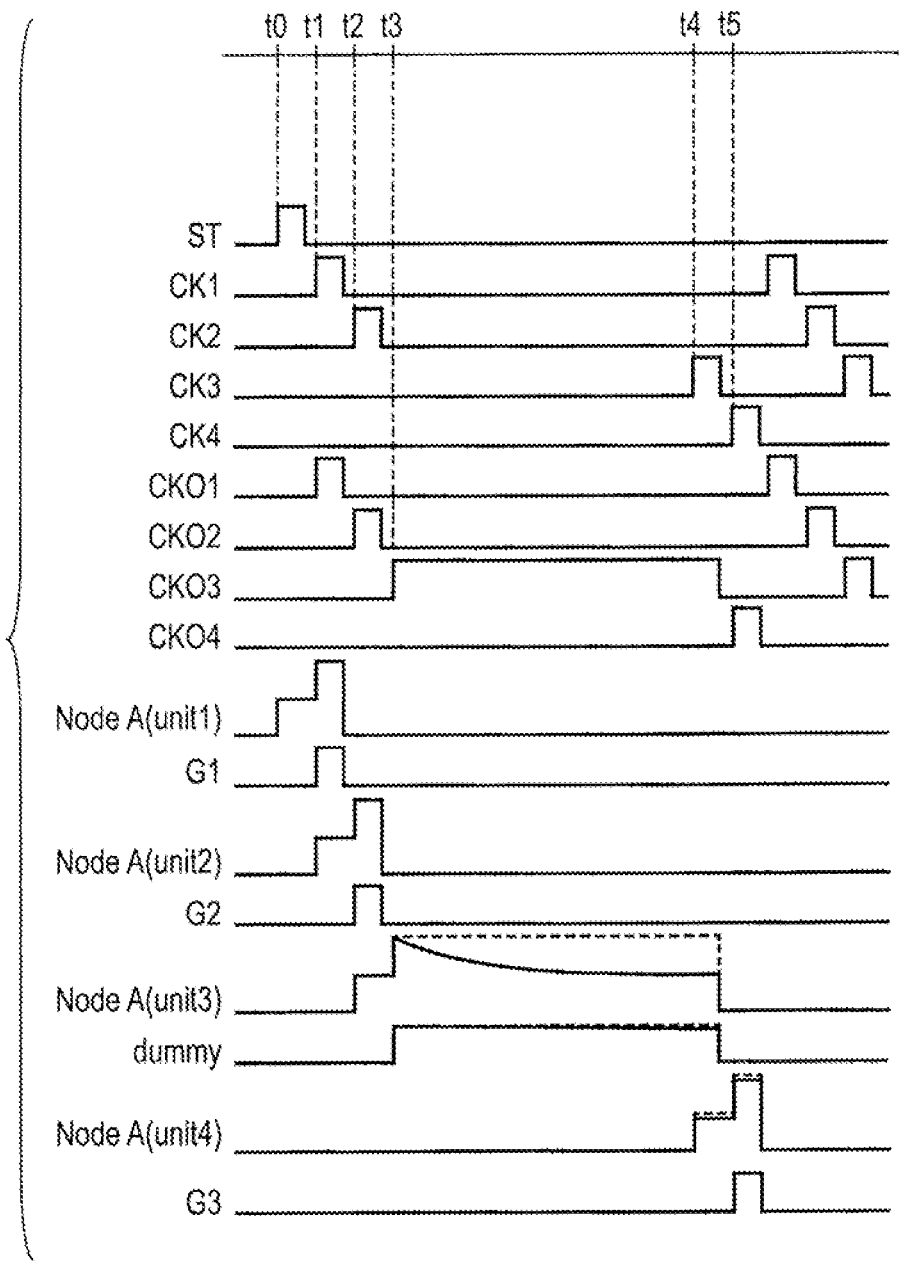
FIG. 15 is a timing chart showing an operation of the shift register in the liquid crystal display device according to the Second Embodiment.

FIG. 15 is a timing chart showing an operation of the shift register in the liquid crystal display device according to the Second Embodiment. FIG. 15 shows progression of input/output signals (ST, CK1 to CK4, CKO1 to CKO4, and G1 to G3) and the variation in the node A potential at each time (t0, t1, t2, . . . ) in four unit register circuits 31 including a dummy at the first to fourth stages.

At time t0, when the controller 2 outputs the trigger signal ST, the electric potential of the node A in the unit register circuit 31 at the first stage which inputs the trigger signal ST becomes H level. At time t1, when the controller 2 outputs the clock signal CKO1 (similar to the clock signal CK1), the electric potential of the node A further rises by the bootstrap effect. The clock signal CKO1 having no potential drop is thereby output as the gate signal G1.

In contrast, the electric potential of the node A in the unit register circuit 31 at the second stage which inputs the gate signal G1 at time t1 becomes H level. At time t2, when the controller 2 outputs the clock signal CKO2 (similar to the clock signal CK2), the electric potential of the node A further rises by the bootstrap effect. The clock signal CKO2 having no potential drop is thereby output as the gate signal G2.

The electric potential of the node A in the unit register circuit 31 at the third stage (dummy) to which the gate signal G2 is input at time t2 becomes H level. A scan stop period is started in this state and driving the scanning line is temporarily stopped. At time t3, when the controller 2 outputs the clock signal CKO3 which maintains the H level during the scan stop period, the electric potential of the node A further rises by the bootstrap effect. For this reason, the clock signal CKO3 having no potential drop is output as a dummy signal dummy. In the unit register circuit 31 at the fourth stage, since the transistor T13 is turned off, the node A is not held at the H level but maintained at L level even if the dummy signal dummy becomes H level.

The controller 2 sets the clock signal CK3 at H level at timing a short time before the scan stop period is ended and at which the potential drop caused by the leak is small. In the unit register circuit 31 at the fourth stage, the transistor TI3 is turned on, the transistor T1 is thereby turned on and the node A is held at the H level. Then the controller 2 turns off the clock signals CK3 and CKO3 at the time when the scan stop period is ended.

Since the clock signal CKO3 maintains H level, reduction in the electric potential of the node A in the unit register circuit 31 at the third stage (dummy) during the scan stop period, which is caused by the leak current, is suppressed (in a state indicated by a solid line in the chart). In addition, reduction in the electric potential of the dummy signal dummy which is caused by the leak current is also suppressed (in a state indicated by the solid line in the chart). As a result, reduction in the electric potential of the node A in the unit register circuit 31 at the fourth stage during the scan stop period is also suppressed. If the scan stop period becomes a long time, however, reduction in the electric potential of the node A in the unit register circuit 31 at the fourth stage may proceed due to reduction in the electric potential of the dummy signal dummy caused by the leak current. In the Second Embodiment, reduction in the electric potential of the node A in the unit register circuit 31 is suppressed (in a state indicated by a solid line in the chart) by maintaining the node A of the unit register circuit 31 at the fourth stage at the H level, at timing of small reduction in the electric potential of the dummy signal dummy before the scan stop period is ended.

At time t5 after the end of the scan stop period, when the controller 2 outputs the clock signal CKO4, the electric potential of the node A in the unit register circuit 31 at the fourth stage further rises by the bootstrap effect. The gate signal G3 of small potential drop is thereby output and the display operation can be restarted.

The Second Embodiment comprises a dummy unit register circuit 31 which does not drive the scanning line, between the unit register circuit 31 which drives the scanning line immediately before the scan stop period and the unit register circuit 31 which drives the scanning line immediately after the scan stop period, and can restart the scan drive after the end of the scan stop period by the configuration that the H-level signal is taken in the unit register circuit 31 at the subsequent stage at timing at which the potential drop of the dummy signal dummy is small before the scan stop signal period is ended (i.e., timing at which a variation in the electric potential caused by the leak of the dummy signal dummy is small before the scan stop period is ended).

Third Embodiment

The Third Embodiment is different from the First Embodiment and the Second Embodiment with respect to a feature that a dummy circuit is further provided at a subsequent stage of a dummy circuit. Parts which are the same as or similar to the First Embodiment and the Second Embodiment are denoted by the same reference numerals and their detailed explanations are omitted.

In the First Embodiment and the second Embodiment, an electric potential of a node A in a unit register circuit 31 at a subsequent stage is set by an output voltage of the dummy circuit. However, if the scan drive can be restarted but the output voltage of the dummy circuit is much lowered, the gate line drive waveform becomes a distorted waveform, which results in display failure. In the Third Embodiment, occurrence of display failure is avoided by further providing a dummy circuit at a subsequent stage of the dummy circuit and rectifying the gate line drive waveform.

FIG. 16 is an illustration showing a configuration of the shift register used in the liquid crystal display device according to the Third Embodiment. In FIG. 16, the configuration of the shift register shown in FIG. 7 is shown in a simple form, similarly to FIG. 10.

The shift register used in the liquid crystal display device according to the Third Embodiment comprises dummy unit register circuits 31 which do not drive the scanning lines at two stages (previous stage, subsequent stage), i.e., a front stage and a back stage, between the unit register circuit 31 which drives the scanning line immediately before the scan stop period and the unit register circuit 31 which drives the scanning line immediately after the scan stop period. In addition, the Third Embodiment comprises two types of clock signals (CK1 to CK4 and CKO1 to CKO4) as the clock signals, similarly to the Second Embodiment.

Figure 17:
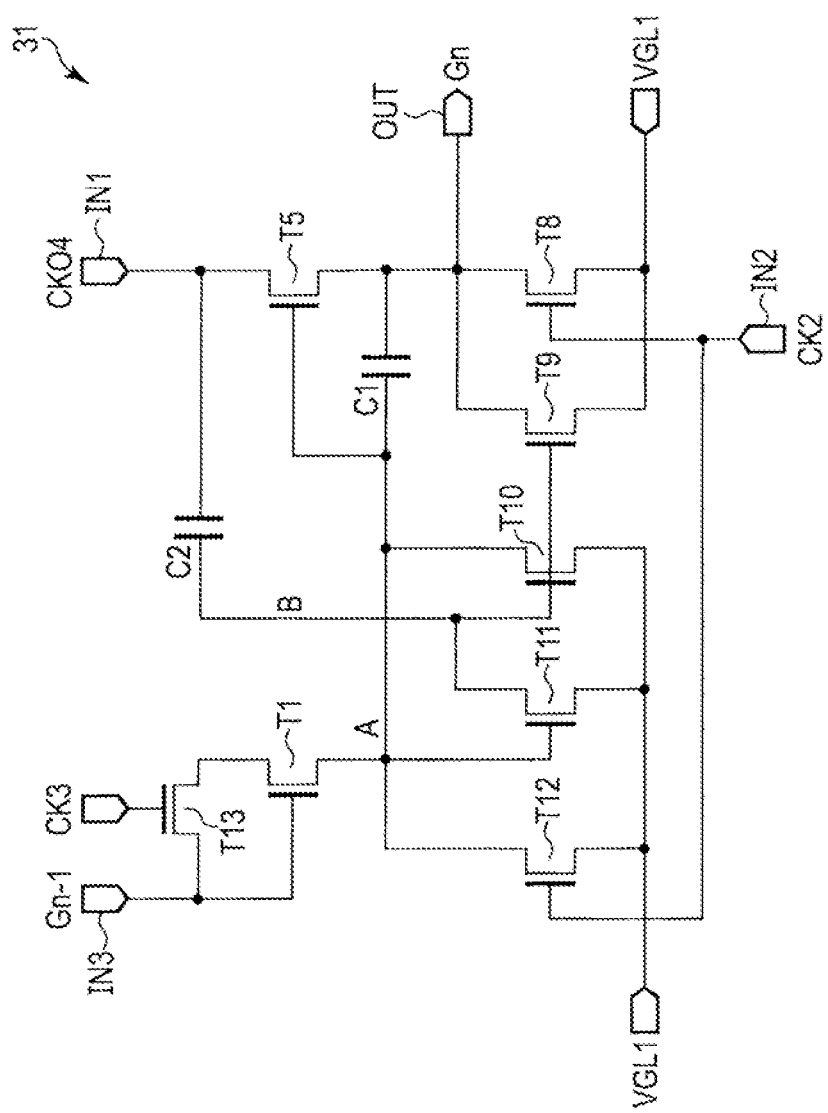
FIG. 17 is a circuit diagram showing a unit register circuit provided in a dummy circuit at a subsequent stage in the liquid crystal display device according to the Second Embodiment.

FIG. 17 is a circuit diagram showing the unit register circuit 31 provided in the back-stage dummy circuit, in the liquid crystal display device according to the Third Embodiment. A circuit of the unit register circuit 31 shown in FIG. 17 is the same as the unit register circuit 31 provided at the subsequent stage of the dummy circuit shown in FIG. 14 and detailed explanations are omitted. In the Third Embodiment, a controller 2 outputs the clock signals (CK1 to CK4 and CKO1 to CKO4) and controls the shift register in the following manner.

The controller 2 outputs the clock signal CKO3 which maintains the H level for a predetermined period during the scan stop period. In the unit register circuit 31 of the dummy circuit at the front stage, the electric potential of the node A thereby further rises by the bootstrap effect. For this reason, the dummy signal dummy having no potential drop is output. In the unit register circuit 31 of the back-stage dummy circuit shown in FIG. 17, since a transistor T13 is turned off, a node A is not held at H level but maintained at L level even if a dummy signal dummy from the front-stage dummy circuit becomes H level.

The controller 2 sets the clock signal CK3 at H level at timing a short time before the scan stop period is ended and at which the potential drop of the dummy signal dummy is small (i.e., timing a short time before the scan stop period is ended and at which a variation in the electric potential caused by the leak of the dummy signal dummy is small). In the unit register circuit 31 of the dummy circuit at the back stage, the transistor T13 is turned on, the transistor T1 is thereby turned on and the node A is held at the H level. Then the controller 2 turns off the clock signals CK3 and CKO3 at the time when the scan stop period is ended.

Then, the controller 2 turns on the clock signal CKO4. In the unit register circuit 31 of the dummy circuit at the subsequent stage, the electric potential of the node A thereby further rises by the bootstrap effect. For this reason, the clock signal CKO4 having no potential drop (waveform rectified) is output to a unit register circuit 31 at the fifth stage as a dummy signal dummy. The following operations are the same as those of the First Embodiment and detailed explanations are omitted.

According to the Third Embodiment, occurrence of display failure can be avoided since a dummy circuit is further provided at a subsequent stage of the dummy circuit and the gate line drive waveform can be rectified.

Fourth Embodiment

The Fourth Embodiment is different from the First to Third Embodiments with respect to a feature that a unit register circuit 31 is composed to reduce a leak from a node A during a scan stop period. Parts which are the same as or similar to the First to Third Embodiments are denoted by the same reference numerals and their detailed explanations are omitted.

FIG. 18 is a circuit diagram showing a unit register circuit 31 in a liquid crystal display device according to the Fourth Embodiment. FIG. 19 is a table showing a range of a power supply potential and a clock signal potential supplied to a unit register circuit 31 in the liquid crystal display device according to the Fourth Embodiment. The unit register circuit 31 is different from the circuit shown of the Second Embodiment shown in FIG. 14 with respect to values of electric potentials of a low power source voltage VGL2 and a clock signal which are surrounded by circles in FIG. 19.

More specifically, clock signals (CKO1 to CKO4) are 16.5V/−9.5V but clock signals (CK1 to CK4) are 16.5V/−13.5V, i.e., a low potential is set to be lower. In addition, an electric potential of VGL1 supplied to sources of transistors T8 and T9 is −9.5V but an electric potential of VGL2 supplied to sources of transistors T10, T11, T1, and T13 is set to −11.5V, i.e., a lower value.

In transistor T5, a current may flow between a source and a drain even when a gate-source voltage Vgs is 0V depending on the type (for example, a depression type). As a result of occurrence of the leak, power consumption may be increased, the electric potential of the node may be shifted from an expected potential, and the shift register may not operate. In the Fourth Embodiment, since the electric potential of VGL1 which supplies a source potential of the transistor T5 becomes −9.5V and the electric potential of VGL2 which supplies a gate potential becomes −11.5V, the gate-source voltage Vgs is set to a negative value and a leak current can be reduced.

Similarly, in transistor T8, the electric potential of VGL1 which supplies the source potential becomes −9.5V and the electric potential CK2 of the clock signal which supplies the gate potential becomes −13.5V, and the gate-source voltage Vgs is thereby set to a negative value. In transistor T12, the electric potential of VGL2 which supplies the source potential becomes −11.5V and the electric potential CK2 of the clock signal which supplies the gate potential becomes −13.5V, and the gate-source voltage Vgs is thereby set to a negative value.

Thus, Vgs of an output transistor (T5) which generates the gate signal when the gats drive signal of the shift register is off (non-drive) and Vgs of a switch transistor (T12) which supplies an off-time voltage to the gate of the output transistor are set to values at which the leak current does not flow.

According to each of the above-explained embodiments, even when the scanning line drive operation is temporarily stopped in the display device comprising the scanning line driver composed of a single-channel transistor, driving the scanning line can be restarted.

In each of the above-explained embodiments, the shift register composed of an HMOS transistor has been explained but the same advantages can also be obtained from a shift register composed of a PMOS transistor. In addition, in each of the above-explained embodiments, the examples applied to the gate line driver has been explained but, obviously, the embodiments are not limited to the examples and can be applied to any apparatuses and devices using a shift register.

For example, a panel using liquid crystal of a lateral electric field type such as in-plane switching (IPS) mode and fringe field switching (FES) mode has been explained as the example, but the embodiments are not limited to this form and can also be applied to a panel using liquid crystal of a longitudinal electric field such as twisted nematic (TN) mode and optically compensated bend (OCB) mode. Furthermore, the embodiments can also foe applied to a panel using organic EL.

All of the display devices which can be implemented by a person of ordinary skill in the art through arbitrary design changes to the display devices described above as embodiments of the present invention come within the scope of the present invention as long as they are in keeping with the spirit of the present invention.

Various types of the modified examples and corrected examples are easily conceivable within the category of the ideas of the present invention by a person of ordinary skill in the art and the modified examples and corrected examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the First Embodiment, which are obvious from the descriptions of the present specification or which can be arbitrarily conceived by a person of ordinary skill in the art, are considered to be achievable by the present invention as a matter of course.

Various aspects of the invention can also be extracted from any appropriate combination of constituent elements disclosed in the embodiments. For example, some of the constituent elements disclosed in the embodiments may be deleted. Furthermore, the constituent elements described in different embodiments may be arbitrarily combined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device equipped with a touch detection function, comprising:
   a plurality of display elements disposed in a matrix;
   a plurality of scanning lines disposed along rows in which the plurality of display elements are aligned;
   a plurality of signal lines disposed along columns in which the plurality of display elements are aligned;
   a plurality of switching elements disposed near positions at which the plurality of scanning lines and the plurality of signal lines intersect; and
   a plurality of series-connected unit register circuits sequentially outputting scanning signals which set the

19 plurality of switching elements connected to respective scanning lines of the plurality of scanning lines to be active, wherein a touch detection operation is performed in a scan stop period in which outputting the scanning signals to the plurality of scanning lines is stopped, each unit register circuit of the plurality of series-connected unit register circuits is composed of single-channel transistors, holds a signal generated in the unit register circuit based on a scanning signal output from a previous unit register circuit, and outputs a scanning signal in a case where a voltage leak of the held signal is equal to or lower than a predetermined value when a predetermined clock signal is input from outside, a dummy unit register circuit which does not drive a scanning line is provided between a unit register circuit at a previous stage which drives a last scanning line before start of the scan stop period and a unit register circuit at a subsequent stage which drives a first scanning line after end of the scan stop period, the dummy unit register circuit continues outputting a scanning signal to the unit register circuit at the subsequent stage during the scan stop period, the unit register circuit at the subsequent stage comprises a switch which switches input of the scanning signal output from the dummy unit register circuit to an inner circuit, a transistor constituting an internal circuit is a depression-type single-channel nMOS transistor, an electric potential of the clock signal and an electric potential of a scanning signal are set such that when the transistor constituting the internal circuit is turned off, an electric potential supplied to a gate terminal of the transistor is made smaller than an electric potential supplied to a source terminal of the transistor and leak from the transistor is reduced; and each unit register circuit of the plurality of series-connected unit register circuits comprises:

a first transistor having a first terminal to which a scanning signal output from a previous unit register circuit is input, and a gate terminal which is connected to the first terminal;

a node A connected to a second terminal of the first transistor;

a second transistor having a first terminal which is connected to the node A, a gate terminal to which a scanning signal output from a unit register circuit after a next unit register circuit is input, and a second terminal to which a power supply voltage is input;

a fifth transistor having a gate terminal which is connected to the node A, a first terminal to which a first clock signal is input, and a second terminal which outputs a scanning signal;

a first capacitor whose ends are connected respectively to the gate terminal and the second terminal of the fifth transistor;

a tenth transistor having a first terminal which is connected to the node A, a second terminal to which the power supply voltage is input, and a gate terminal which is connected to a node B;

a second capacitor whose ends are connected respectively to the node B and the first terminal of the fifth transistor; and an eleventh transistor having a gate terminal which is connected to the node A, a first terminal which is

20 connected to the node B, and a second terminal to which the power supply voltage is input.

2. A display device equipped with a touch detection function, comprising:

a plurality of display elements disposed in a matrix;

a plurality of scanning lines disposed along rows in which the plurality of display elements are aligned;

a plurality of signal lines disposed along columns in which the plurality of display elements are aligned;

a plurality of switching elements disposed near positions at which the plurality of scanning lines and the plurality of signal lines intersect; and a plurality of series-connected unit register circuits sequentially outputting scanning signals which set the plurality of switching elements connected to respective scanning lines of the plurality of scanning lines to be active, wherein a touch detection operation is performed in a scan stop period in which outputting the scanning signals to the plurality of scanning lines is stopped, each unit register circuit of the plurality of series-connected unit register circuits is composed of single-channel transistors, holds a signal generated in the unit register circuit based on a scanning signal output from a previous unit register circuit, and outputs a scanning signal in a case where a voltage leak of the held signal is equal to or lower than a predetermined value when a predetermined clock signal is input from outside, a dummy unit register circuit which does not drive a scanning line is provided between a unit register circuit at a previous stage which drives a last scanning line before start of the scan stop period and a unit register circuit at a subsequent stage which drives a first scanning line after end of the scan stop period, the dummy unit register circuit continues outputting a scanning signal to the unit register circuit at the subsequent stage during the scan stop period, input of the scanning signal output from the dummy unit register circuit to an internal circuit of the unit register circuit at the subsequent stage is performed before the scan stop period is ended and at timing at which a potential variation caused by leak of the scanning signal output from the dummy unit register circuit is equal to or smaller than a predetermined value; and each unit register circuit of the plurality of series-connected unit register circuits comprises:

a first transistor having a first terminal to which a scanning signal output from a previous unit register circuit is input, and a gate terminal which is connected to the first terminal;

a node A connected to a second terminal of the first transistor;

a second transistor having a first terminal which is connected to the node A, a gate terminal to which a scanning signal output from a unit register after a next unit register is input, and a second terminal to which a power supply voltage is input;

a fifth transistor having a gate terminal which is connected to the node A, a first terminal to which a first clock signal is input, and a second terminal which outputs a scanning signal;

a first capacitor whose ends are connected respectively to the gate terminal and the second terminal of the fifth transistor;

a tenth transistor having a first terminal which is connected to the node A, a second terminal to which the power supply voltage is input, and a gate terminal which is connected to a node B;

a second capacitor whose ends are connected respectively to the node B and the first terminal of the fifth transistor; and an eleventh transistor having a gate terminal which is connected to the node A, a first terminal which is connected to the node B, and a second terminal to which the power supply voltage is input.

3. The display device according to claim 2, wherein the single-channel transistors are pMOS transistors or nMOS transistors.

4. The display device according to claim 2, wherein the single-channel transistors are composed of organic semiconductor or oxide semiconductor.

5. The display device according to claim 2, wherein a transistor constituting the internal circuit is a depression-type single-channel nMOS transistor, and an electric potential of the clock signal and an electric potential of a scanning signal are set such that when the transistor constituting the internal circuit is turned off, an electric potential supplied to a gate terminal of the transistor is made smaller than an electric potential supplied to a source terminal of the transistor and leak from the transistor is reduced.

6. A display device equipped with a touch detection function, comprising:

a plurality of display elements disposed in a matrix;

a plurality of scanning lines disposed along rows in which the plurality of display elements are aligned;

a plurality of signal lines disposed along columns in which the plurality of display elements are aligned;

a plurality of switching elements disposed near positions at which the plurality of scanning lines and the plurality of signal lines intersect; and a plurality of series-connected unit register circuits sequentially outputting scanning signals which set the plurality of switching elements connected to respective scanning lines of the plurality of scanning lines to be active, wherein a touch detection operation is performed in a scan stop period in which outputting the scanning signals to the plurality of scanning lines is stopped, each unit register circuit of the plurality of series-connected unit register circuits is composed of single-channel transistors, holds a signal generated in the unit register circuit based on a scanning signal output from a previous unit register circuit, and outputs a scanning signal in a case where a voltage leak of the held signal is equal to or lower than a predetermined value when a predetermined clock signal is input from outside, first dummy unit register circuit and second dummy unit register circuit which do not drive the plurality of scanning lines are provided between a unit register circuit at a previous stage which drives a last scanning line before start of the scan stop period and a unit register circuit at a subsequent stage which drives a first scanning line after end of the scan stop period, the first dummy unit register circuit continues outputting a scanning signal to the second dummy unit register circuit during the scan stop period, and input of the scanning signal output from the first dummy unit register circuit to an internal circuit of the second dummy unit register circuit is performed before the scan stop period is ended and at timing at which a potential variation caused by leak of the scanning signal output from the first dummy unit register circuit is equal to or smaller than a predetermined value; and each unit register circuit of the plurality of series-connected unit register circuits comprises:

a first transistor having a first terminal to which a scanning signal output from a previous unit register circuit is input, and a gate terminal which is connected to the first terminal;

a node A connected to a second terminal of the first transistor;

a second transistor having a first terminal which is connected to the node A, a gate terminal to which a scanning signal output from a unit register after a next unit register is input, and a second terminal to which a power supply voltage is input;

a fifth transistor having a gate terminal which is connected to the node A, a first terminal to which a first clock signal is input, and a second terminal which outputs a scanning signal;

a first capacitor whose ends are connected respectively to the gate terminal and the second terminal of the fifth transistor;

a tenth transistor having a first terminal which is connected to the node A, a second terminal to which the power supply voltage is input, and a gate terminal which is connected to a node B;

a second capacitor whose ends are connected respectively to the node B and the first terminal of the fifth transistor; and an eleventh transistor having a gate terminal which is connected to the node A, a first terminal which is connected to the node B, and a second terminal to which the power supply voltage is input.

7. The display device according to claim 6, wherein the second dummy unit register circuit comprises a switch which switches input of the scanning signal output from the first dummy unit register circuit to an inner circuit.

8. The display device according to claim 7, wherein the single-channel transistors are composed of organic semiconductor or oxide semiconductor.

* * * * *